(12) United States Patent
Terashima

(10) Patent No.: US 6,894,348 B2
(45) Date of Patent: May 17, 2005

(54) SEMICONDUCTOR DEVICE

(75) Inventor: Tomohide Terashima, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/834,954

(22) Filed: Apr. 16, 2001

(65) Prior Publication Data

US 2002/0060341 A1 May 23, 2002

(30) Foreign Application Priority Data

Nov. 21, 2000 (JP) .................................... 2000-353945

(51) Int. Cl.$^7$ ............................................. H01L 29/76
(52) U.S. Cl. ....................... 257/339; 257/327; 257/335
(58) Field of Search .................................. 257/213, 288, 257/327, 335, 339, 355, 653–654, 343

(56) References Cited

U.S. PATENT DOCUMENTS

| | | | | |
|---|---|---|---|---|
| 4,485,392 A | * | 11/1984 | Singer ........................ | 357/22 |
| 4,495,512 A | * | 1/1985 | Isaac et al. .................. | 357/34 |
| 5,256,582 A | * | 10/1993 | Mosher et al. ............... | 437/13 |
| 5,629,558 A | * | 5/1997 | Galbiati et al. ............. | 257/653 |
| 5,874,767 A | * | 2/1999 | Terashima et al. ........... | 257/487 |
| 5,895,939 A | * | 4/1999 | Ueno ........................ | 257/279 |
| 5,899,714 A | * | 5/1999 | Farrenkopf et al. .......... | 438/202 |
| 5,940,700 A | * | 8/1999 | Galbiati et al. ............. | 438/237 |
| 6,051,457 A | * | 4/2000 | Ito ............................ | 438/208 |
| 6,127,695 A | * | 10/2000 | Harris et al. ................ | 257/77 |
| 6,291,862 B1 | * | 9/2001 | Chevalier ................... | 257/392 |
| 6,348,714 B1 | * | 2/2002 | Lin et al. ................... | 257/347 |

FOREIGN PATENT DOCUMENTS

| | | | | |
|---|---|---|---|---|
| EP | 0252173 A1 | * | 1/1988 | ........... H01L/29/80 |
| EP | 817387 A1 | * | 7/1998 | ....... H03K/19/0185 |
| JP | 02-122672 | | 5/1990 | |
| JP | 08-321606 | | 12/1996 | |

OTHER PUBLICATIONS

S.M. Sze, "Physics of Semiconductor Devices", John Wiley and Sons, second edition (1981), pp. 74–79.*

Ludikhuize, A.W., "A Versatile 700–1200–V IC Process for Analog and Switching Applications", IEEE Trans. Electron Devices, vol. 38, issue 7, pp. 1582–9 Jul. 1991 (ISSN: 0018–9383).*

* cited by examiner

Primary Examiner—Nathan J. Flynn
Assistant Examiner—Johannes Mondt
(74) Attorney, Agent, or Firm—McDermott Will & Emery LLP

(57) ABSTRACT

An N+ buried diffusion region is formed between a P− silicon substrate and an N− epitaxial layer and a P+ buried diffusion region is formed between the N+ buried diffusion region and the N− epitaxial layer. An N diffusion region, a P diffusion region and an N diffusion region are formed in the surface for the N− epitaxial layer. The surface of the P+ buried diffusion region located, approximately, beneath the N diffusion region is recessed so as to go far away from the N diffusion region and a narrowed part is formed in this part. Thereby, in the OFF condition, the depletion layer further extends in the part where the narrowed part is formed. As a result, the withstanding voltage of the semiconductor device is increased.

12 Claims, 33 Drawing Sheets

US 6,894,348 B2

SEMICONDUCTOR DEVICE

BACKGROUND OF THE INVENTION

1. Field of the Invention

The present invention relates to a semiconductor device, in particular, to a semiconductor device including double diffused metal oxide semiconductor (hereinafter referred to as "DMOS") transistors.

2. Description of the Background Art

As an example of a semiconductor device for switching a heavy current, a semiconductor device including DMOS transistors is described. As shown in FIG. 30, an N– epitaxial layer 102 is formed on a p– silicon substrate 101. An N+ buried diffusion region 103 is formed between a p– silicon substrate 101 and an N– epitaxial layer 102. In addition, a P+ buried diffusion region 104 is formed between the N+ buried diffusion region 103 and the N– epitaxial layer 102.

An N diffusion region 107 is formed on the surface of the N– epitaxial layer 102. A P diffusion region 106 is formed so as to surround this N diffusion region 107 around the periphery. In addition, a P diffusion region 105 which contacts the P diffusion region 106 and which reaches the P+ buried diffusion region 104 is formed on the surface of the N– epitaxial layer 102. A gate electrode 110 is formed above the surface of the P diffusion region 106, which is located between the N diffusion region 107 and the N– epitaxial layer 102, with an insulating film interposed in between.

A source electrode 111 which is electrically connected to the N diffusion region 107 is formed. In addition, a silicon oxide film 109 for isolation is formed on the surface of the N– epitaxial layer 102. A drain electrode 112 is formed on the side opposite to the source electrode 111, with a silicon oxygen film 109 located in between. The drain electrode 112 is electrically connected to the N diffusion region 108, which is formed in the N– epitaxial layer 102. A semiconductor device according to a prior art is configured as described above.

Though, in a conventional semiconductor device, the electric field tends to be concentrated on the corner parts of the P diffusion region 106, as shown in FIG. 31 the electric field which is concentrated on the corner parts is relaxed by a depletion layer which extends from the P+ buried diffusion region 104 (RESURF effect) in the above described semiconductor device.

Thereby, in this semiconductor device, the withstanding voltage can be increased to the level based on the width L of the depletion layer wherein the depletion layer edge which extends towards the side of the N diffusion region 108 and the depletion layer edge which extends towards the side of the P+ buried diffusion region 104 from the interface between the N– epitaxial layer 102 and the P+ buried diffusion region 104 are in the greatest proximity to each other.

On the contrary, however, the withstanding voltage is limited by this part where both depletion layer edges are in the greatest proximity to each other in this semiconductor device. In order to further increase the withstanding voltage it is necessary to make the distance between both depletion layer edges longer and to achieve this objective measures for increasing the film thickness of the N– epitaxial layer 102 are effective.

In the case that the film thickness of the N– epitaxial layer 102 is made thicker, however, it is necessary to form the P diffusion region 105, or the like, for isolating the N– epitaxial layer 102 correspondingly deeper. In addition, in the case that a vertical type NPN transistor, or the like, is formed as a semiconductor element, a current flows in the vertical direction and a problem arises that the resistance of the semiconductor device increases in this case.

SUMMARY OF THE INVENTION

The present invention is provided in order to solve the above described problem and has the purpose of providing a semiconductor device which can increase the withstanding voltage easily without making the film thickness of the N– epitaxial layer thicker and without changing the process therefore.

The first semiconductor device according to one aspect of the present invention includes a semiconductor substrate having a main surface, a first conductive type semiconductor layer, a first buried impurity region of the first conductive type, a second buried impurity region of a second conductive type and a first impurity region of the second conductive type, a second impurity region of the first conductive and a semiconductor element. The semiconductor layer of the first conductive type is formed on the surface of the semiconductor substrate. The first buried impurity region of the first conductive type is formed between the semiconductor layer and the semiconductor substrate. The second buried impurity region of the second conductive type formed between the first buried impurity region and the semiconductor layer. The first impurity region of the second conductive type is formed on the surface of the semiconductor layer and is electrically connected to the second buried impurity region. The second impurity region of the first conductive type is formed on the surface or inside of the semiconductor layer located in a region above the second buried impurity region. The semiconductor element includes the first impurity region and the second impurity region, is formed on the surface of the semiconductor layer and has a switching function. Then, when this semiconductor element is in the OFF condition the withstanding voltage is secured by the depletion layer extending from the interface between the second buried impurity region and the semiconductor layer. The second buried impurity region includes a first recessed part which is recessed in the direction where the surface of the second buried impurity region becomes far away from the second impurity region in a part located, approximately, directly beneath the second impurity region or a first gap part wherein the second buried impurity region is discontinued.

According to this semiconductor device, since the first recessed part, wherein the surface of the second buried impurity region is recessed so as to go far away from the second impurity region in the part located, approximately, directly beneath the second impurity region, or the first gap part, wherein this region is disconnected, is formed, an effective thickness of the semiconductor layer in this part is increased. Thereby, in the OFF condition, the depletion layer edge which extends towards the side of the second buried impurity region of the depletion layer, which extended from the interface between the semiconductor layer and the second buried impurity region, is located deeper in the part directly beneath the second impurity region than in the other parts. As a result, compared to a semiconductor device according to the prior art, the width of the depletion layer located directly beneath the second impurity region is expanded and, therefore, the withstanding voltage in the part directly beneath the second impurity region is raised so that the withstanding voltage of the entire semiconductor device is increased.

In order to provide a DMOS transistor as a semiconductor element, it is desirable to concretely include a third impurity region of the first conductive type which is formed on the surface of the first impurity region so as to be surrounded by the first impurity region and an electrode part which is formed on the surface of the first impurity region sandwiched between the third impurity region and the semiconductor layer, with an insulating film interpolated in between.

In addition, in the case that an IGBT is provided as a semiconductor element, it is desirable to further include a fourth impurity region of the second conductive type which is formed so as to contact the second impurity region.

And, in the case that a bipolar type transistor is provided as a semiconductor element, it is desirable to include a fifth impurity region of the second conductive type which is formed on the surface of the semiconductor layer.

In addition, it is desirable for the second buried impurity region to include a plurality of the first recessed parts.

In this case, since in the OFF condition many parts where the width of the depletion layer is expanded are formed, the withstanding voltage can be increased for a semiconductor device which has a wider second impurity region.

In addition, it is desirable for the second buried impurity region to include a plurality of the first gap parts.

In this case, the effective thickness of the semiconductor layer in this part further increases so that, in the OFF condition, the width of the depletion layer extending from the interface between the semiconductor layer and the second buried impurity region becomes larger. As a result, the withstanding voltage of the semiconductor device is further increased.

Furthermore, it is desirable for the second buried impurity region to include a plurality of regions which are in an electrically floating condition, respectively, by means of a plurality of the first gap parts.

In this case, the potentials of the individual second buried impurity regions which are in the floating condition increase along the direction towards the side of the second impurity region from the side of the first impurity region. Thereby, the potential gap between the potential of the second buried impurity region located in the vicinity of the area directly beneath the second impurity region and the potential of the second impurity region becomes smaller. As a result, the withstanding voltage of the semiconductor device can be increased by the amount by which the potential difference has been reduced.

In addition, it is desirable for the first buried impurity region to include a second recessed part which is recessed in the direction where the surface of the first buried impurity region goes far away from the second impurity region in the part located, approximately, directly beneath the first gap part or a second gap part wherein the first buried region is disconnected.

In this case, impurities which form the first buried impurity region are restrained from diffusing into the part of the semiconductor layer between the second buried impurity regions located so as to sandwich the first gap part and, therefore, the impurity concentration in this part is restrained from increasing. Thereby, the increase of the pinch off voltage can be controlled to a small amount even in the case that the interval between the first gap parts is made wider so that the effective film thickness of the semiconductor layer located directly beneath the second impurity region can be made thicker. As a result, the withstanding voltage of the semiconductor device can be further increased.

Furthermore, it is preferable for the junction interface between the first buried impurity region and the second buried impurity region to be uneven.

In this case, the junction interface between the first buried impurity region and the second buried impurity region becomes uneven and, thereby, the depletion layer extending from this junction interface further extends. As a result, the withstanding voltage of this junction part increases so that, in the case that, for example, a bipolar transistor is provided as a semiconductor element, the withstanding voltage of the semiconductor device can be increased at the time when the potential of the collector is negatively biased.

The second semiconductor device according to one aspect of the present invention includes a semiconductor substrate having a main surface, a semiconductor layer of a first conductive type, a buried impurity region of the first conductive type, a first impurity region of the first conductive type, a second impurity region of a second conductive type and a semiconductor element. The semiconductor layer of the first conductive type is formed on the main surface of the semiconductor substrate. The buried impurity region of the first conductive type is formed between the semiconductor substrate and the semiconductor layer. And the first impurity region of the first conductive type is formed on the surface of the semiconductor layer and is electrically connected to the buried impurity region. The second impurity region of the second conductive type is formed on the surface of the semiconductor layer which is located in the upper region of the buried impurity region. The semiconductor element includes the first impurity region and the second impurity region, is formed on the surface of the semiconductor layer and has a switching function. When this semiconductor element is in the OFF condition, the withstanding voltage is secured by a depletion layer which extends from the interface between the second impurity region and the semiconductor layer. The buried impurity region includes a recessed part, wherein the surface of the buried impurity region is recessed in the direction of going far away from the second impurity region in the part located, approximately, directly beneath the second impurity region, or a gap part where the buried region is disconnected.

According to this semiconductor device, in the OFF condition a depletion layer extends, in particular, from the interface between the second impurity region and the semiconductor layer. At this time, a recessed part wherein the surface of the buried impurity region is recessed so as to go far away from the second impurity region or a gap part wherein this region is disconnected is formed in a part located, approximately, directly beneath the second impurity region and, therefore, the effective thickness of the semiconductor layer is increased in this part so that the depletion layer edge which extends to the side of the buried impurity region can reach a deeper position. Thereby, the width of the depletion layer is broadened so as to increase the withstanding voltage of the semiconductor device.

In the case that a DMOS transistor is provided as a semiconductor element, it is desirable to include a third impurity region of the first conductive type which is formed on the surface of the second impurity region so as to be surrounded by the second impurity region and an electrode part formed above the surface of the second impurity region which are sandwiched between the third impurity region and the semiconductor layer with an insulating film interpolated in between.

In addition, in the case that a bipolar transistor is provided as a semiconductor element it is desirable to include a fourth impurity region of the second conductive type that is formed on the surface of the semiconductor layer.

In addition, it is desirable for the recessed part or the gap part to be formed in a part to which the depletion layer reaches.

In this case, the extending depletion layer can be extended further and, therefore, in the case that, for example, a bipolar transistor is provided as a semiconductor element the withstanding voltage can be increased without lowering the current amplification ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
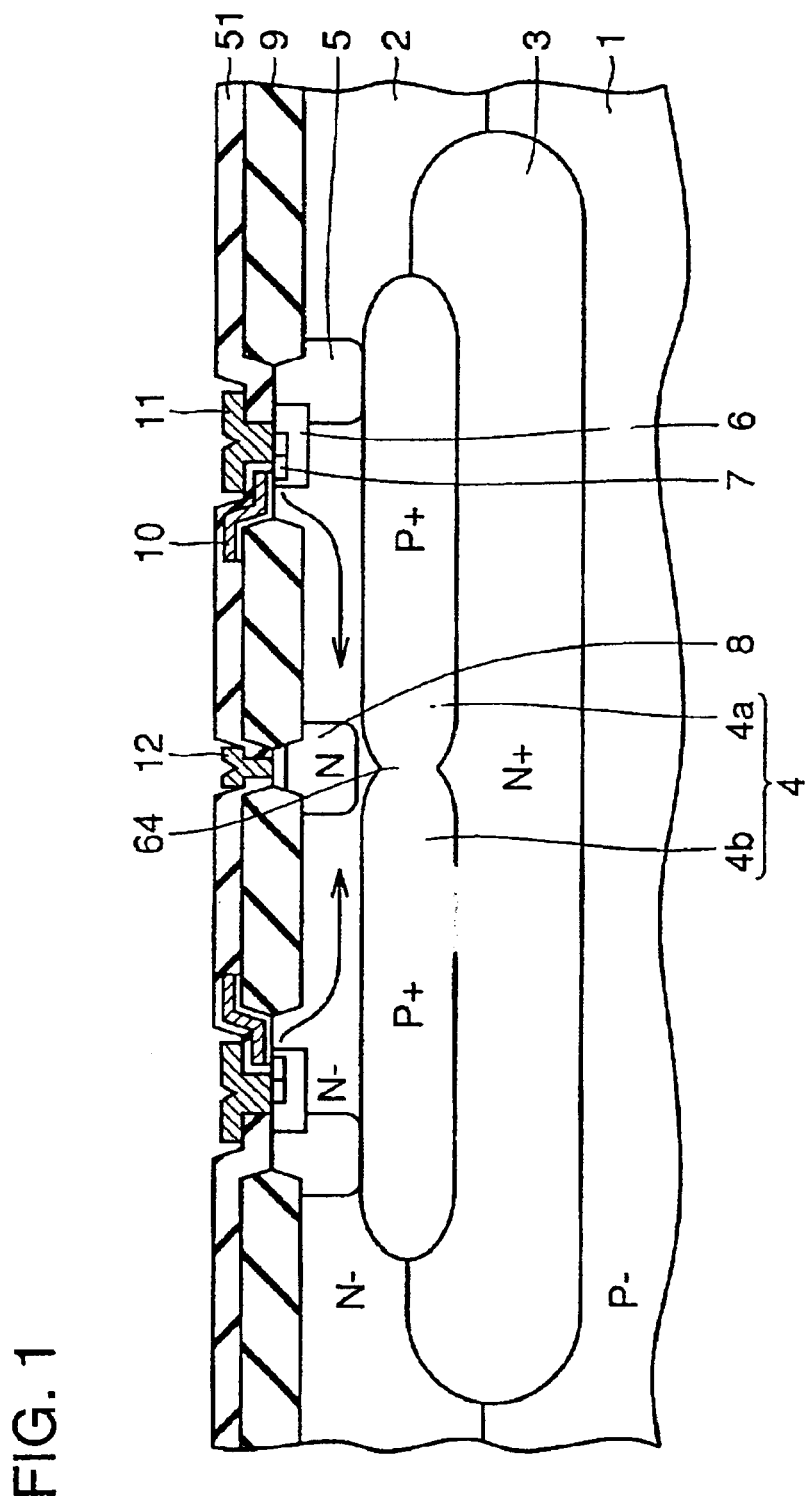
FIG. 1 is a cross section view of a semiconductor device according to a first embodiment of the present invention.

A semiconductor device including a DMOS transistor according to the first embodiment of the present invention is described. As shown in FIG. 1, an N− epitaxial layer is formed on a P− silicon substrate 1. An N+ buried diffusion region 3 is formed between the P− silicon substrate 1 and the N− epitaxial layer 2. In addition, a P+ buried diffusion region 4 is formed between the N+ buried diffusion region and the N− epitaxial layer 2.

An N diffusion region 7 is formed on the surface of the N− epitaxial layer 2. A P diffusion region 6 is formed so as to surround the N diffusion region 7 around the periphery. In addition, a P diffusion region 5 which contacts with the P diffusion region 6 and reaches the P+ buried diffusion region 4 is formed on the surface of the N− epitaxial layer 2. A gate electrode 10 is formed above the surface of the P diffusion region 6 located between the N diffusion region 7 and the N− epitaxial layer 2 with an insulating film interpolated in between.

A source electrode 11 which is electrically connected to the N diffusion region 7 is formed. In addition, a silicon oxide film 9 for isolation is formed on the surface of the N− epitaxial layer 2. A drain electrode 12 is formed on the side opposite to the source electrode 11 with the silicon oxide film 9 sandwiched in between. The drain electrode 12 is electrically connected to the N diffusion region 8 formed in the N– epitaxial layer 2.

Then, in the present semiconductor device, the surface of the P+ buried diffusion region 4 located, approximately, directly beneath the N diffusion region 8 is recessed so as to go far away from the N diffusion region 8 and, in particular, in this part the P+ buried diffusion region 4 is formed so as to have a narrowed part. This narrowed part 64 is, for example, formed along the direction in which the N diffusion region 8 extends.

Figure 2:
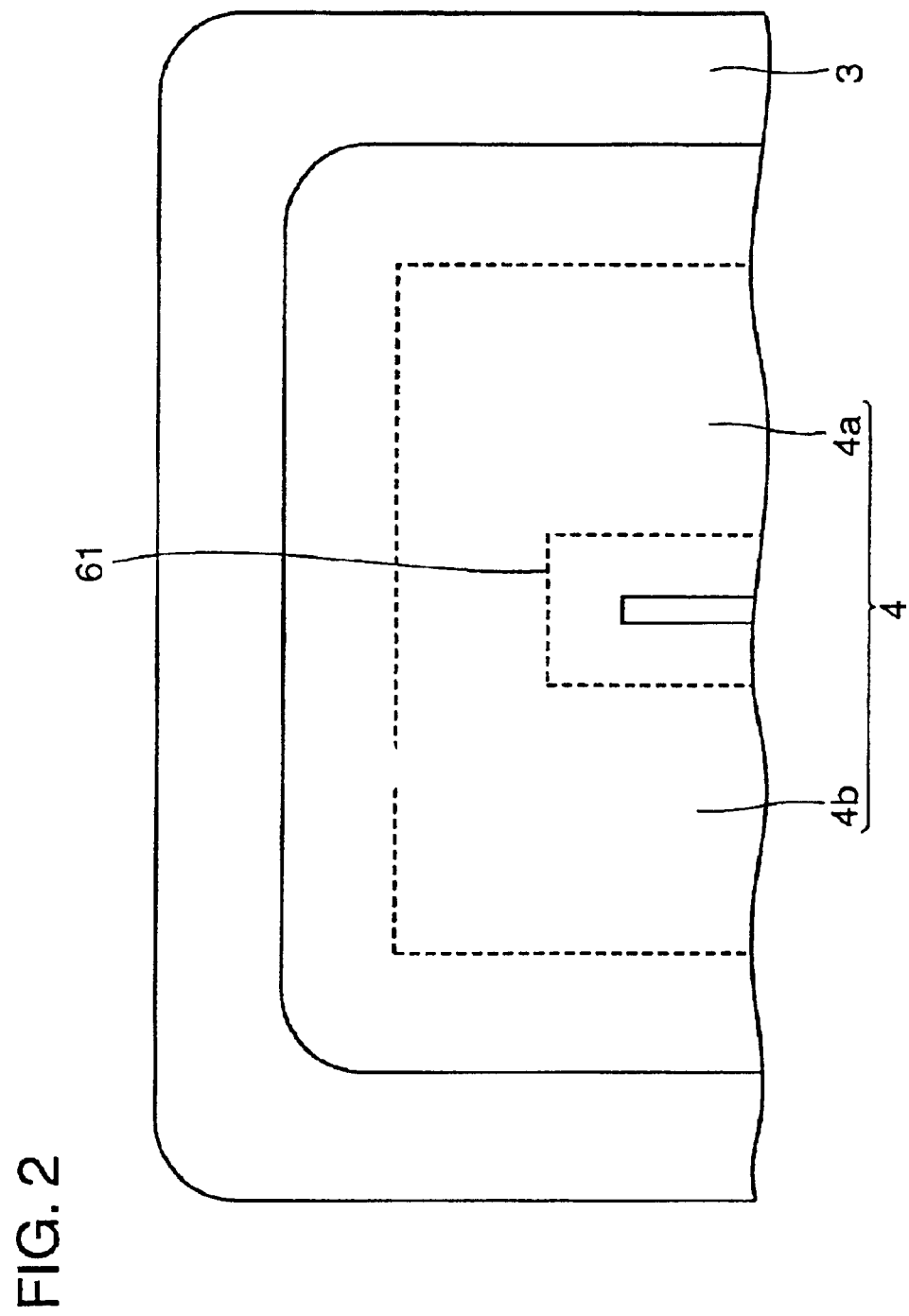
FIG. 2 is a plan view for describing the formation method of the P+ buried diffusion region in the above embodiment.

Such a narrowed part 64 is formed, as shown in FIG. 2, by applying an ion injection treatment using the pattern 61 of the photoresist which covers, at least, the regions corresponding to the positions directly beneath the N diffusion region 8 as a mask and by being submitted to the subsequent heat processing.

That is to say, through the heat processing the injected impurities diffuse into the region of the N– epitaxial layer 2 located directly beneath the N diffusion region 8 and into the N+ buried diffusion region 3, the P+ buried diffusion region 4a, 4b are connected to each other in this part so that a narrowed part 64 is formed in this part.

In the above described semiconductor device, a narrowed part 64 is formed in a part of the P+ buried diffusion region 4, which is located directly beneath the N diffusion region 8, so that the surface of the P+ buried diffusion region 4 is recessed so as to go far away from the N diffusion region 8 and, thereby, in comparison with the case without such a narrowed part, the effective thickness of the N– epitaxial layer 2 is increased in this part.

Figure 3:
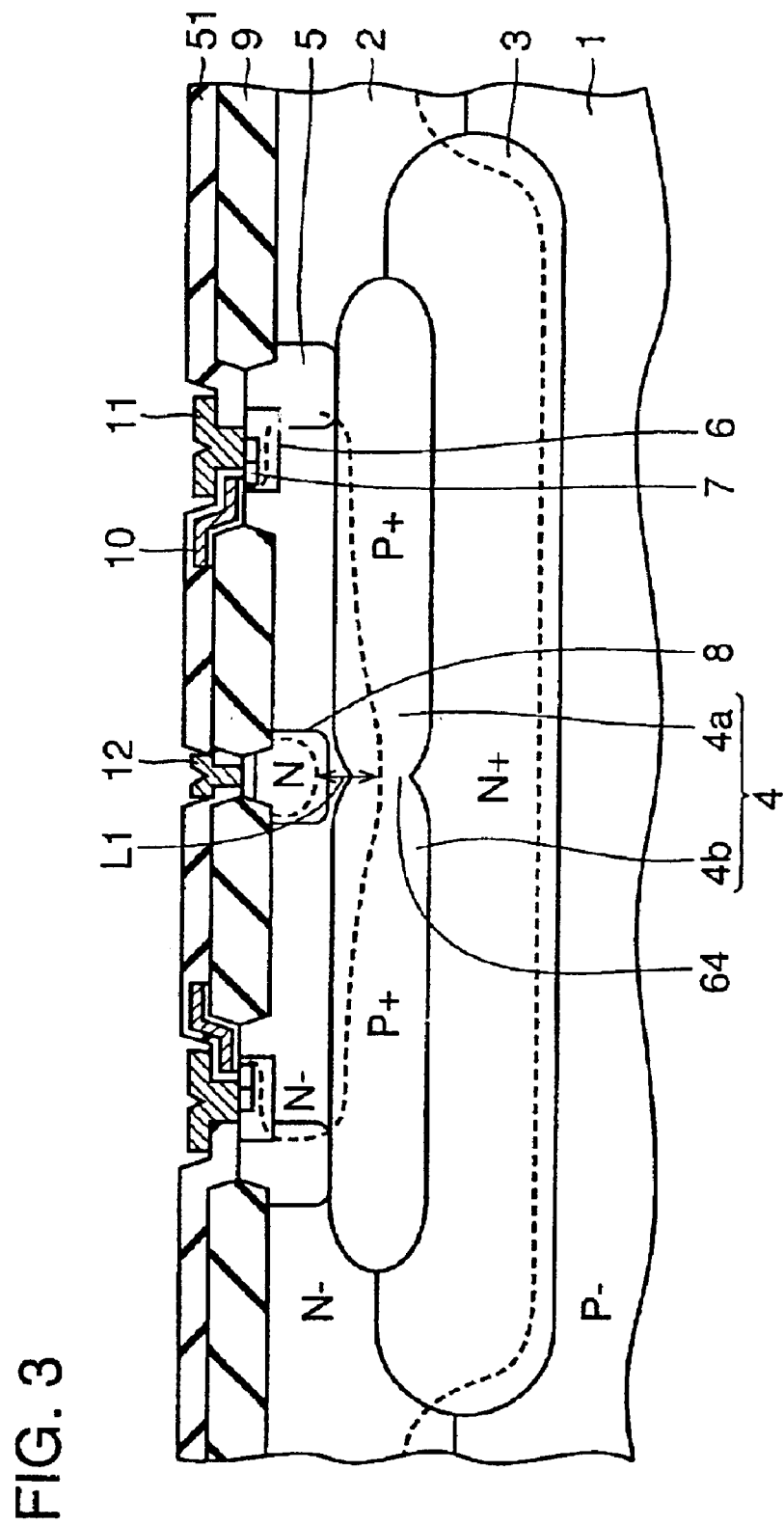
FIG. 3 is a cross section view showing a condition of the depletion layer in the OFF condition in the above embodiment.

Therefore, in the OFF condition a depletion layer extends from the interface between the N– epitaxial layer 2 and the P+ buried diffusion region 4 and, at this time, at the edge of the depletion layer which extends towards the side of the P+ buried diffusion region 4 the part directly beneath the N diffusion region 8 is located deeper than the other parts, as shown in FIG. 3.

As a result, the width L1 of the depletion layer located directly beneath N diffusion region 8 is more extended in comparison with that in a conventional semiconductor device so that the withstanding voltage in the part directly beneath drain electrode 12 rises so as to increase the withstanding voltage of the entire semiconductor device.

Here, though in this embodiment, a case is cited as an example for the description wherein the narrowed part of the P+ buried diffusion region 4 is formed, approximately, directly beneath the N diffusion region 8 along the N diffusion region 8, such a narrowed part may be formed intermittently in a dotted form. In addition, the region which is to become the P+ buried diffusion region 4 may be initially formed in a dotted form and the diffusion regions in respective dots are connected to each other through heat processing so as to form the P+ buried diffusion region 4.

Figure 4:
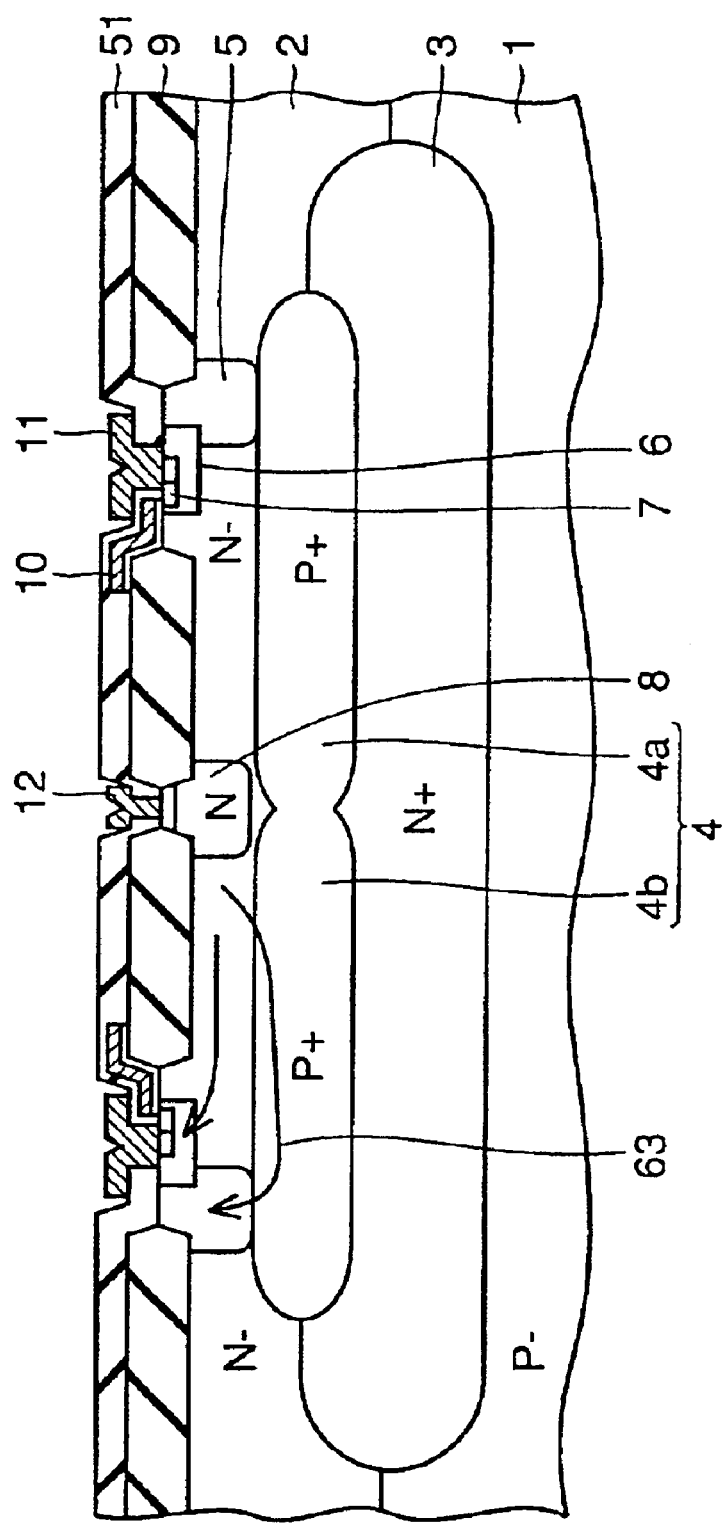
FIG. 4 is a cross section view showing the manner in which the current flows through the P+ buried diffusion region in the above embodiment.
Figure 5:
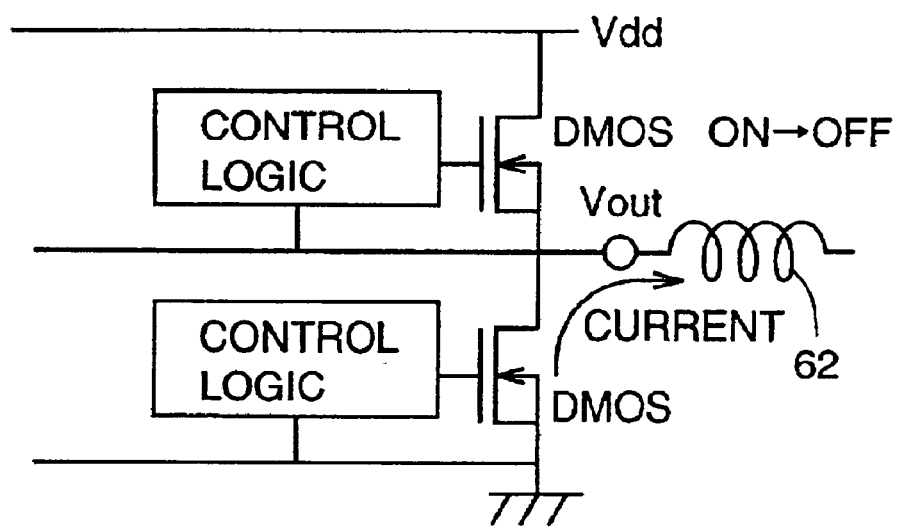
FIG. 5 is a diagram showing a equivalent circuit of the case where the current flows through the P+ buried diffusion region in the above embodiment.

In addition, in the above described semiconductor device, as shown in FIG. 4, there is a case wherein a current 63 flows through the P+ buried diffusion region 4. This is because, as shown in FIG. 5, in the case that a coil 62 (L load) is connected to the drain electrode of the DMOS transistor, the potential of the drain becomes lower than the potential of the source due to the electromotive force of the coil 62 at the moment when the DMOS on the high side is converted to the OFF condition from the ON condition.

Therefore, a current flows towards the coil as indicated by the arrow due to the forward biased operation of a parasitic diode of the DMOS transistor. This current flows through the P+ buried diffusion region 4.

Figure 6:
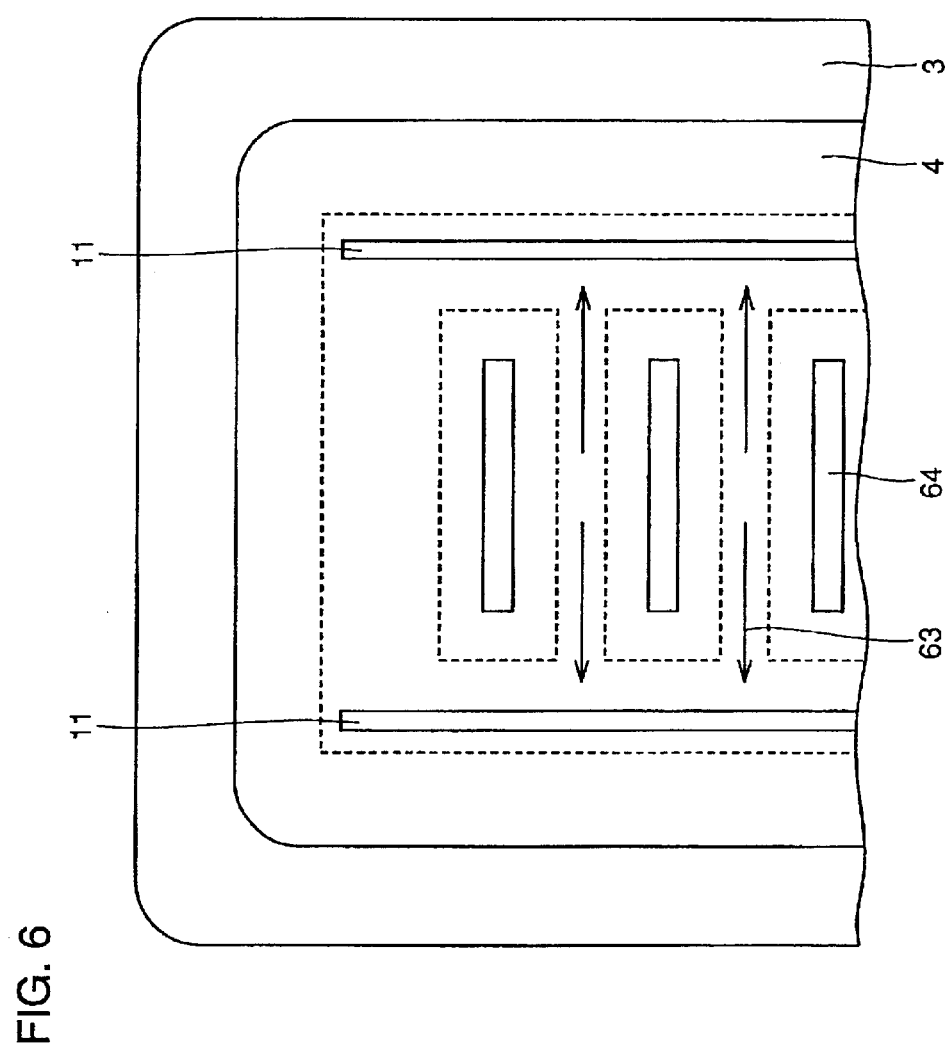
FIG. 6 is another plan view for describing the formation method of the P+ buried diffusion region in the above embodiment.

In such a case, as shown in FIG. 6, the increase of the resistance at the time when a current flows through this P+ buried diffusion region 4 can be limited to the minimum by forming the narrowed part 64 of the P+ buried diffusion region 4 along the direction in which this current 63 flows.

As described above, in the present semiconductor device, the withstanding voltage of the semiconductor device can be easily increased without making the thickness of the N– epitaxial layer 2 thicker by changing, only, the mask pattern for forming the P+ buried diffusion region 4.

Second Embodiment

Figure 7:
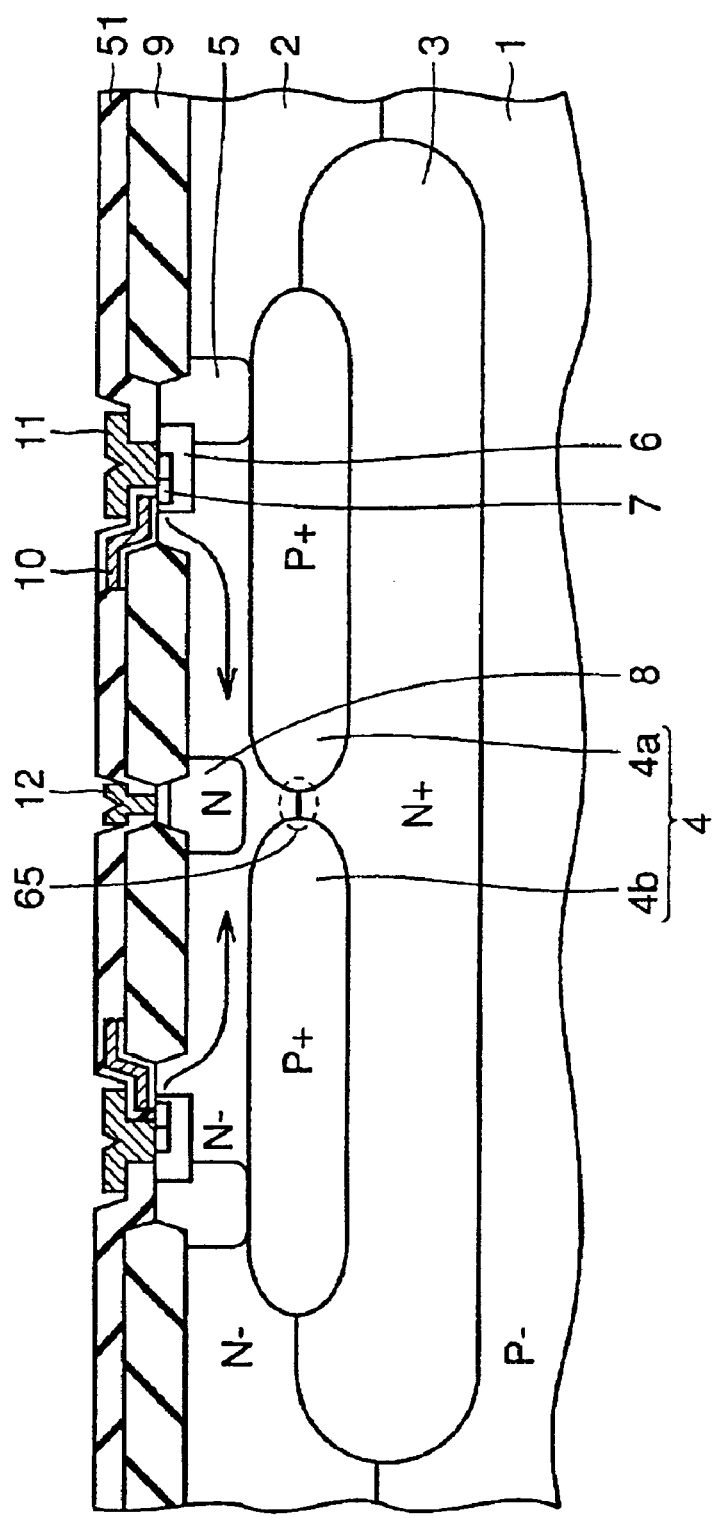
FIG. 7 is a cross section view of a semiconductor device according to a second embodiment of the present invention.

A semiconductor device including a DMOS transistor according to the second embodiment of the present invention is described. As shown in FIG. 7, in the present semiconductor device, a slit 65 is formed in the P+ buried diffusion region 4 located directly beneath the N diffusion region 8.

Here, the configuration not including the above is the same as in the semiconductor device as shown in FIG. 1, which is described in the first embodiment and, therefore, the same symbols are attached to the same components, of which the descriptions are omitted.

The slit 65 in this semiconductor device is formed by applying ion injection processing using the pattern of the photoresist, which covers the corresponding region located directly beneath the N diffusion region 8, as a mask and by being submitted to the subsequent heat processing in the same manner as in the case of the first embodiment.

Though, at this time, through the heat processing, the injected impurities diffuse into the region of the N– epitaxial layer 2 located directly beneath the N diffusion region 8 and into the N+ buried diffusion region 3, the P+ buried diffusion regions 4a, 4b are not, at the final stage, connected to each other in this part unlike the case of the first embodiment.

Particularly in the case of this semiconductor device, since the N+ buried diffusion region 3 and the drain electrode 12 are electrically connected, an inverted bias is applied between the N+ buried diffusion region 3 and the P+ buried diffusion regions 4a, 4b according to the condition for maintaining the withstanding voltage. At this time, it is desirable for the pinch off voltage in the slit 65 to be lower than the withstanding voltage between the N+ buried diffusion region 3 and the P+ buried diffusion regions 4a, 4b.

Figure 8:
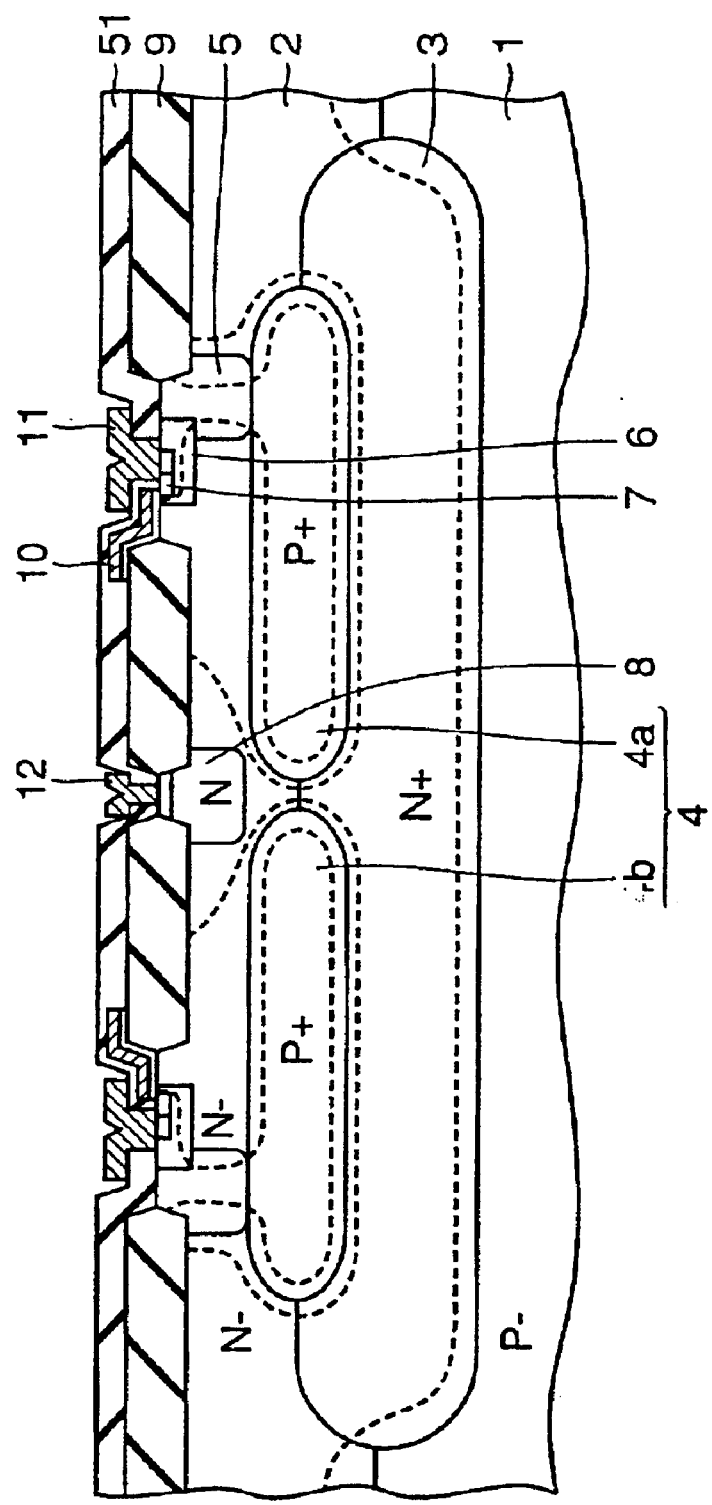
FIG. 8 is a cross section view showing the condition of the depletion layer before the pinch off in the above embodiment.

As shown in FIG. 8, in the condition before the pinch off, the depletion layer formed on the side of the P+ buried diffusion region 4a and the depletion layer formed on the side of the P+ buried diffusion region 4b are not connected. Then, at this time, the drain voltage is equal to the potential of the N+ buried diffusion region 3. In addition, the potential of the N+ buried diffusion region 3 does not rise to, or higher than, the pinch off voltage between the P+ buried diffusion regions 4a and 4b.

Figure 9:
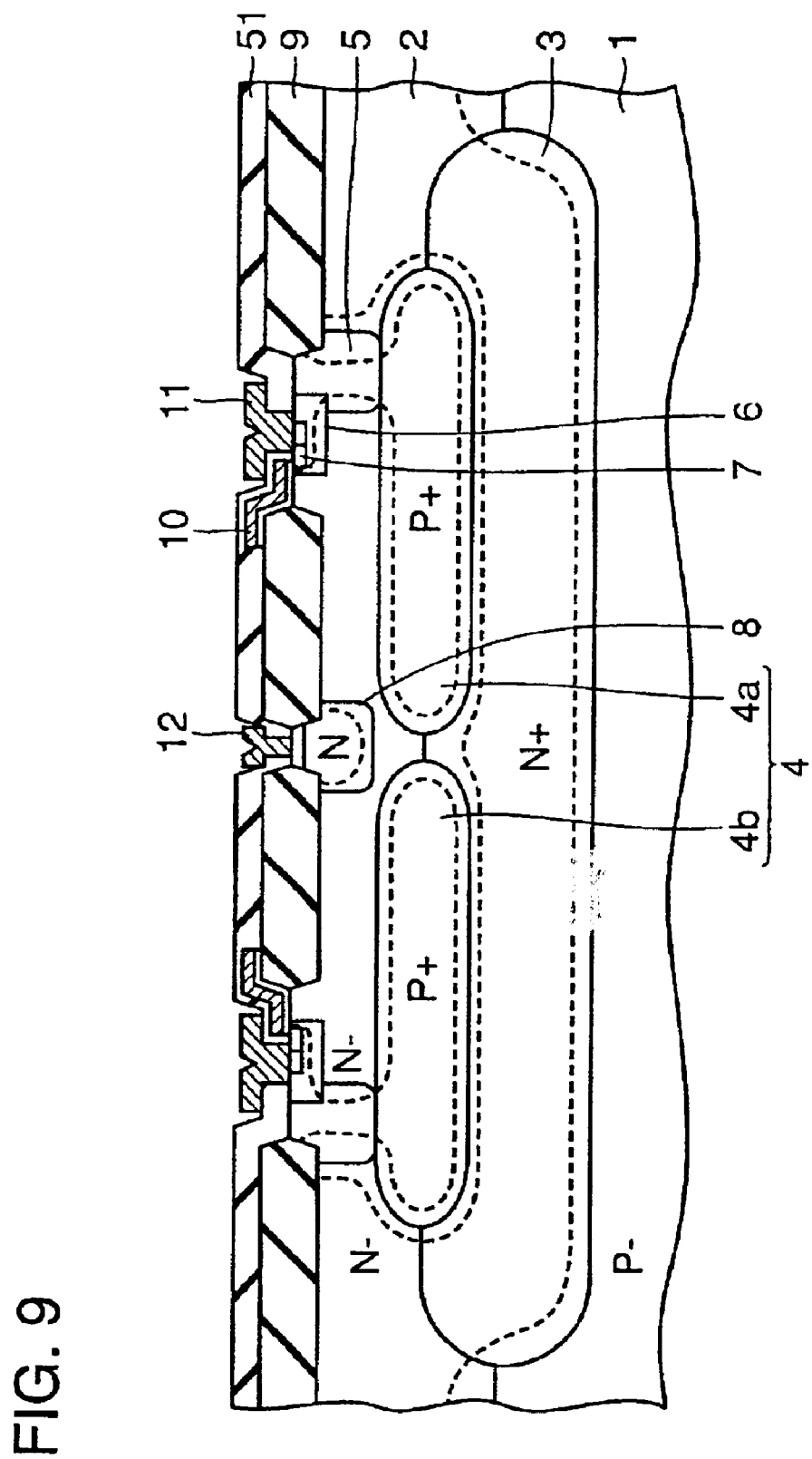
FIG. 9 is a cross section view showing the condition of the depletion layer after the pinch off in the above embodiment.

In the case that the pinch off voltage is 20V, for example, the potential of the N+ buried diffusion region 3 becomes 20V higher than the source potential. Then, as shown in FIG. 9, in the condition after the pinch off, the depletion layer formed on the side of the P+ buried diffusion region 4a and the depletion layer formed on the side of the P+ buried diffusion region 4b are connected.

Thereby, in comparison with the semiconductor device in the first embodiment, the effective thickness of the N– epitaxial layer 2 in the OFF condition has increased (width of the depletion layer) and the withstanding voltage in the part directly beneath the drain electrode 12 increases so as to improve the withstanding voltage of the entire semiconductor device.

In addition, in the same manner as in the case of the first embodiment, the withstanding voltage of the semiconductor device can be improved easily by changing, only, the mask pattern for forming the P+ buried diffusion region.

Third Embodiment

Figure 10:
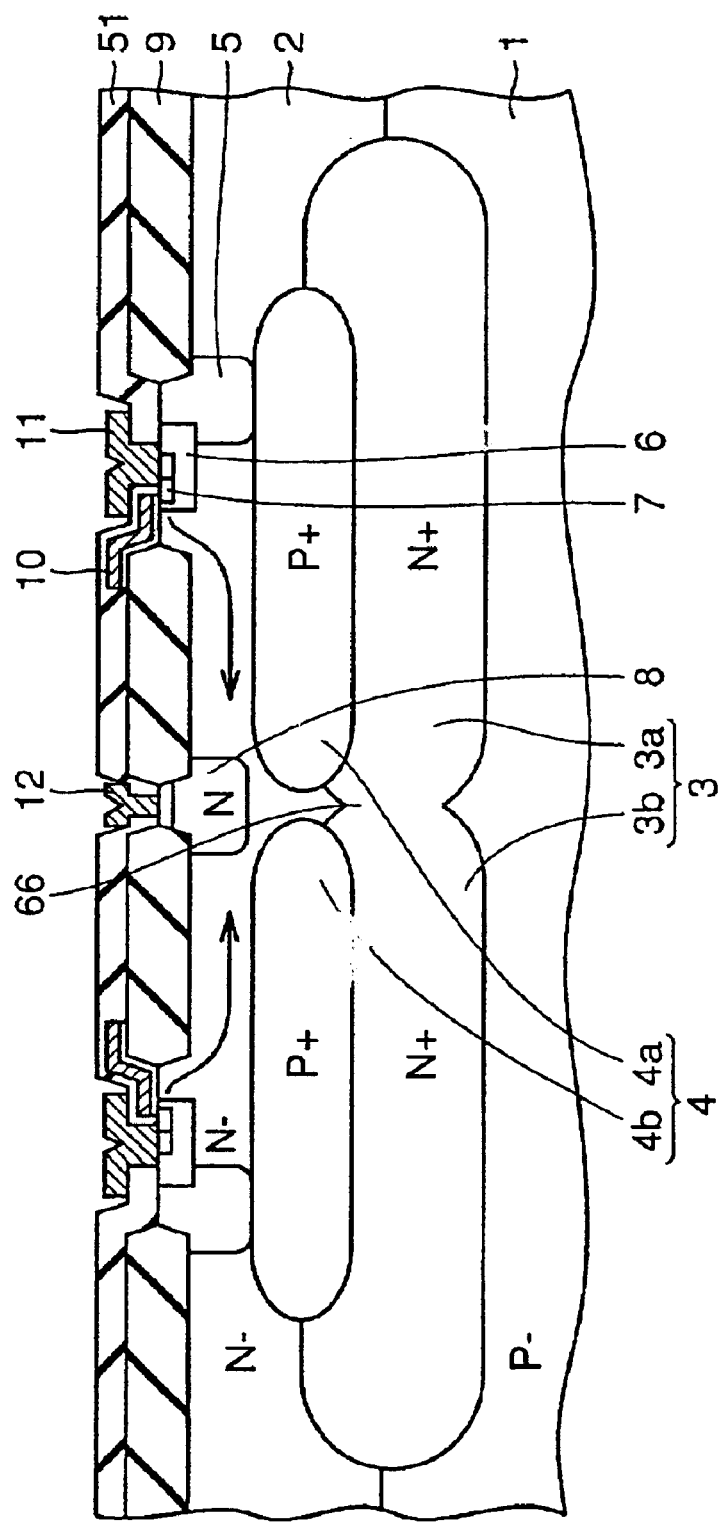
FIG. 10 is a cross section view of a semiconductor device according to a third embodiment of the present invention.

A semiconductor device including a DMOS transistor according to the third embodiment of the present invention is described. As shown in FIG. 10, in the present semiconductor device, a narrowed part 66 is formed in the N+ buried diffusion region 3a, 3b located directly beneath the N diffusion region 8.

Here, the configuration not including the above is the same as in the semiconductor device as shown in FIG. 7, which is described in the second embodiment and, therefore, the same symbols are attached to the same components, of which the descriptions are omitted.

The narrowed part 66 in this N+ buried diffusion region 3 is formed by applying an ion injection processing using the pattern of the photoresist which covers the regions corresponding to the locations directly beneath the N diffusion region 8 as a mask and by submitting to the subsequent heat processing in the same manner as in the case of forming the P+ buried diffusion region 4 in the first embodiment.

At this time, The injected impurities diffuse into the region of the N− epitaxial layer 2 located directly beneath the N diffusion region 8 and into the P− silicon substrate 1 through the heat processing so that, at the final stage, the N+ buried diffusion regions 3a, 3b are connected to each other so as to form the narrowed part 66 in this part.

In the case of the semiconductor device described in the second embodiment, the effective film thickness of the N− epitaxial layer 2 located directly beneath the N diffusion region 8 can be made thicker by broadening the interval of the adjoining P+ buried diffusion regions 4a, 4b.

However, impurities configuring the N+ buried diffusion region 3 diffuse into the part of the N− epitaxial layer 2 between the P+ buried diffusion region 4a and the P+ buried diffusion region 4b so that the impurity concentration of this part rises. Thereby, the depletion layer in this part is restrained from expanding so that the depletion layer is disconnected and the pinch off cannot be achieved. Accordingly, the interval of the adjoining P+ buried diffusion regions 4a, 4b is limited in order to prevent the above.

On the other hand, in the present semiconductor device, the N+ buried diffusion region 3a and the N+ buried diffusion region 3b are connected in the region directly beneath the N diffusion region 8 so that the narrowed part 66 is formed in this part. That is to say, the narrowed part 66 of the N+ buried diffusion region 3 is formed directly beneath the part sandwiched between the P+ buried diffusion region 4a and the P+ buried diffusion region 4b.

Figure 11:
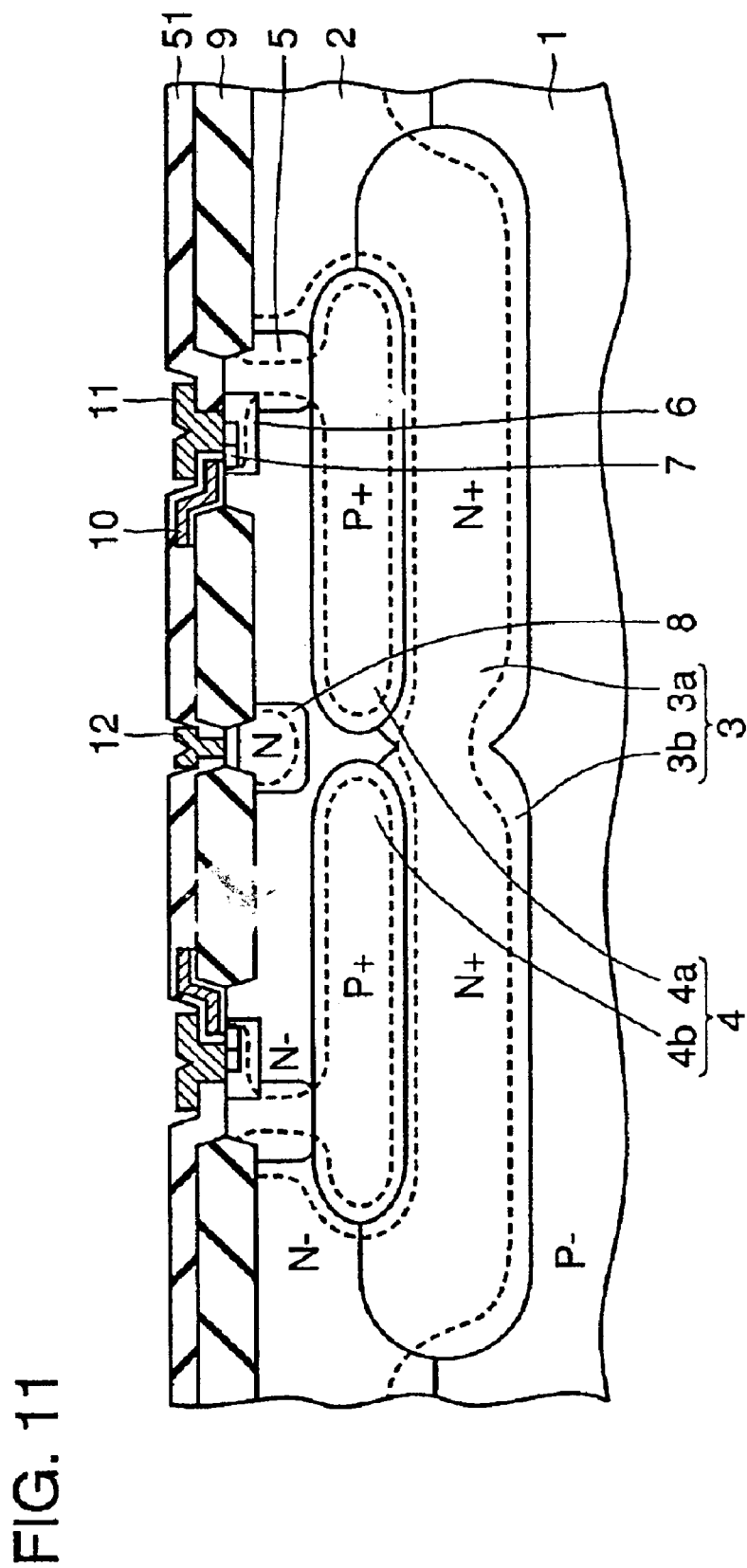
FIG. 11 is a cross section view showing the condition of the depletion layer in the OFF condition in the above embodiment.

Therefore, as shown in FIG. 11, the impurities configuring the N+ buried diffusion region 3 is prevented from diffusing into the part of the N− epitaxial layer 2 between the P+ buried diffusion region 4a and the P+ buried diffusion region 4b so that the impurity concentration in this part is refrained from rising.

Thereby, in comparison with the case of the semiconductor device according to the second embodiment, the rise of the pinch off voltage can be limited to a small level even in the case that the width (interval) of the slit between the P+ buried diffusion region 4a and the P+ buried diffusion region 4b is further broadened and, therefore, the effective film thickness of the N− epitaxial layer 2 located directly beneath the N diffusion region 8 can be made thicker. As a result, the withstanding voltage of the semiconductor device can be further increased.

Fourth Embodiment

Figure 12:
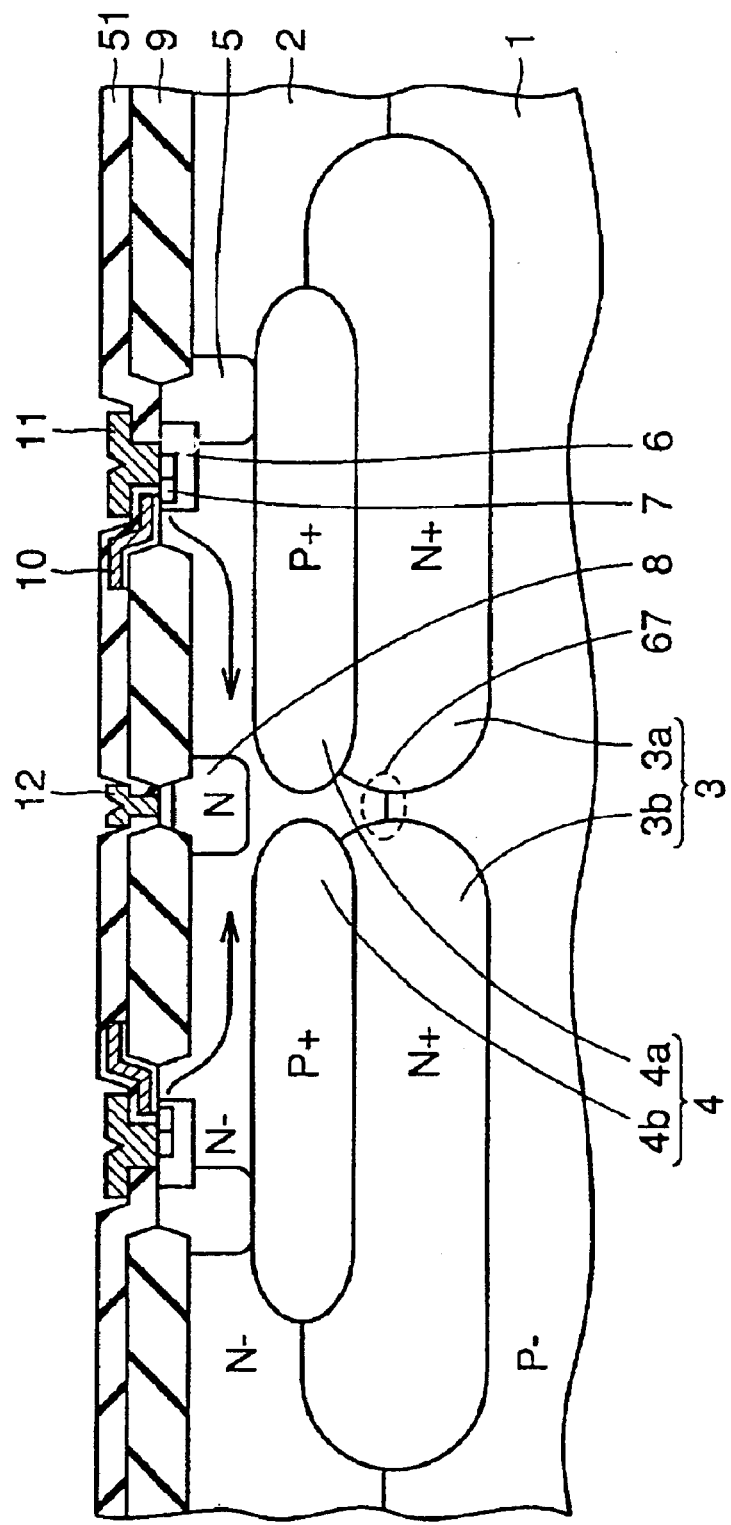
FIG. 12 is a cross section view of a semiconductor device according to a fourth embodiment of the present invention.

A semiconductor device including a DMOS transistor according to the fourth embodiment of the present invention is described. As shown in FIG. 12, in the present semiconductor device, a slit 67 is formed in the N+ buried diffusion region 3 located directly beneath the N diffusion region 8.

Here, the configuration not including the above is the same as in the semiconductor device as shown in FIG. 10, which is described in the third embodiment and, therefore, the same symbols are attached to the same components, of which the descriptions are omitted.

The slit 67 in this N+ buried diffusion region 3 is formed by applying an ion injection processing using the pattern of the photoresist which covers the region corresponding to the location directly beneath the N diffusion region 8 as a mask and by being submitted to the subsequent heat processing in the same manner as in the case of the second embodiment.

At this time, though the injected impurities diffuse into the region of the N− epitaxial layer 2 located directly beneath the N diffusion region 8 and into the P− substrate 1 through the heat processing, the N+ buried diffusion regions 3a, 3b are not connected to each other in this part at the final stage.

In this semiconductor device, when a backward bias is applied between the N+ buried diffusion region 3 and the P− substrate 1, it is desirable that the depletion layer extending from the N+ buried diffusion regions 3a, 3b can be prevented from invading into the N− epitaxial layer 2 through the JFET effect. In addition, it is desirable for the distance between the P+ buried diffusion region 4 and the P− substrate 1 to be maintained to the degree where no punch through phenomenon occurs between the two.

Figure 13:
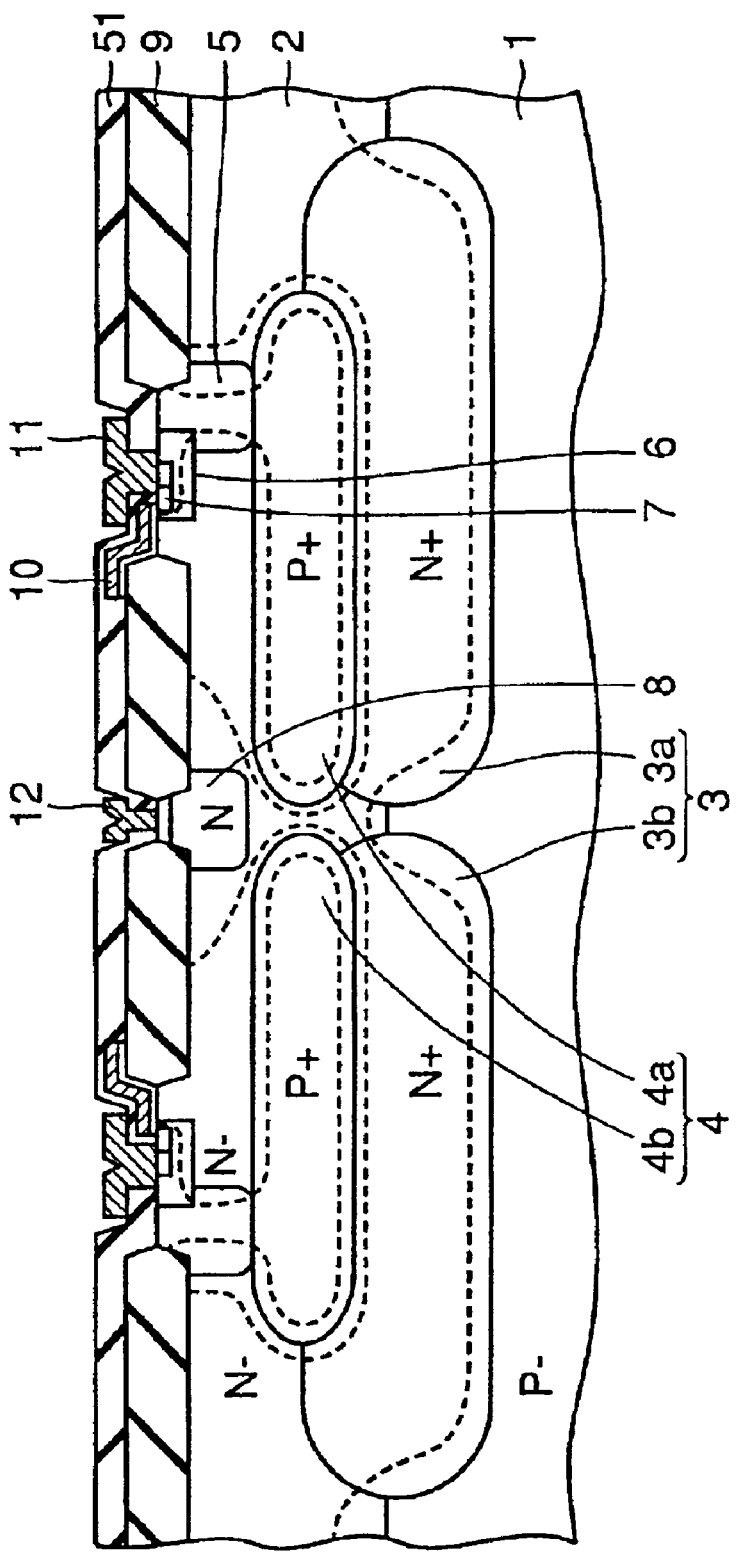
FIG. 13 is a cross section view showing the condition of the depletion layer before the pinch off in the above embodiment.
Figure 14:
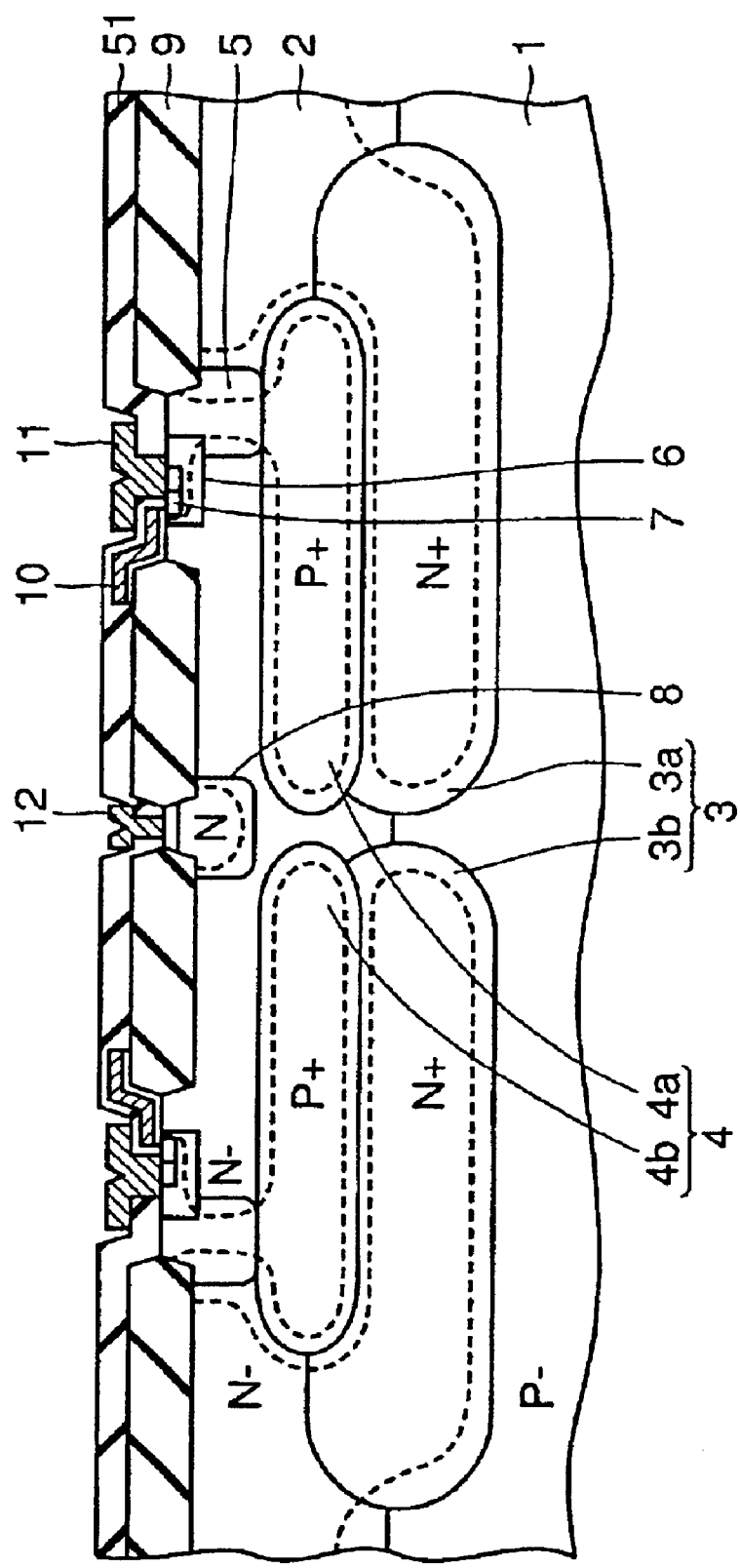
FIG. 14 is cross section view showing the condition of the depletion layer after the pinch off in the above embodiment.

In the condition before the pinch off, as shown in FIG. 13, depletion layers formed on the side of the P+ buried diffusion region 4a and on the side of the P+ buried diffusion region 4b are not connected to each other while in the condition after the pinch off, as shown in FIG. 14, both depletion layers are connected. Since a slit area is formed in the N+ buried diffusion region 3, the depletion layer is broadened so as to include a part of the N− epitaxial layer 2 located in the region sandwiched by the N+ buried diffusion regions 3a, 3b.

Thereby, the effective thickness of the N− epitaxial layer 2 in the OFF condition can be made thicker than in the case of the semiconductor device according to the third embodiment. As a result, the withstanding voltage in the part directly beneath the drain electrode 12 further rises so as to increase the withstanding voltage of the entire semiconductor device.

Fifth Embodiment

Figure 15:
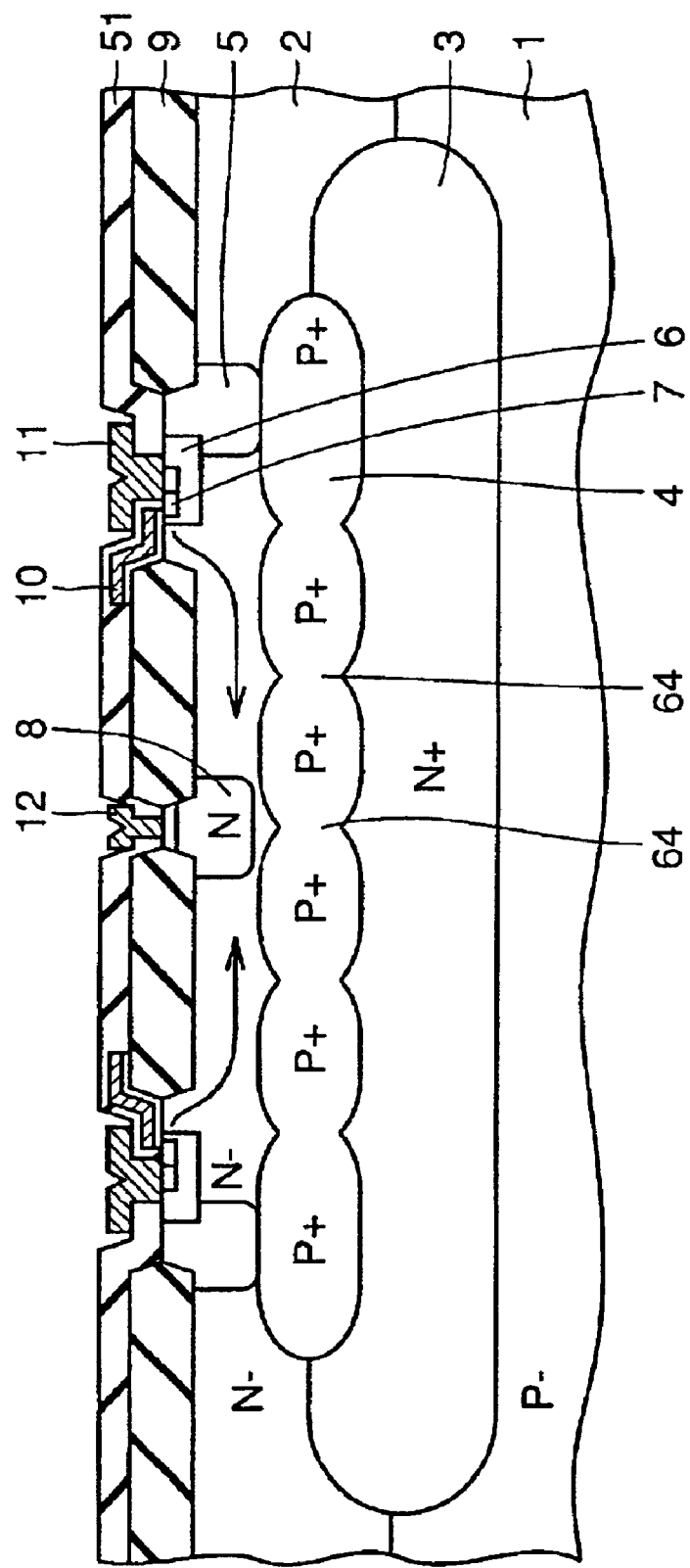
FIG. 15 is a cross section view of a semiconductor device according to a fifth embodiment of the present invention.

A semiconductor device including a DMOS transistor according to the fifth embodiment of the present invention is described. As shown in FIG. 15, in the present semiconductor device, a plurality of the narrowed parts 64 described in the first embodiment are formed in the P+ buried diffusion region 4.

Here, the configuration not including the above is the same as in the semiconductor device as shown in FIG. 1, which is described in the first embodiment and, therefore, the same symbols are attached to the same components, of which the descriptions are omitted.

It is described that, in the semiconductor device according to the first embodiment, there are some cases where a current flows through the P+ buried diffusion region 4 at the time of a predetermined operation. In the case that a current flows through the P+ buried diffusion region 4, it is necessary to maintain the area of the N diffusion region 8 at a comparatively large level in order to secure the current capacity.

Figure 16:
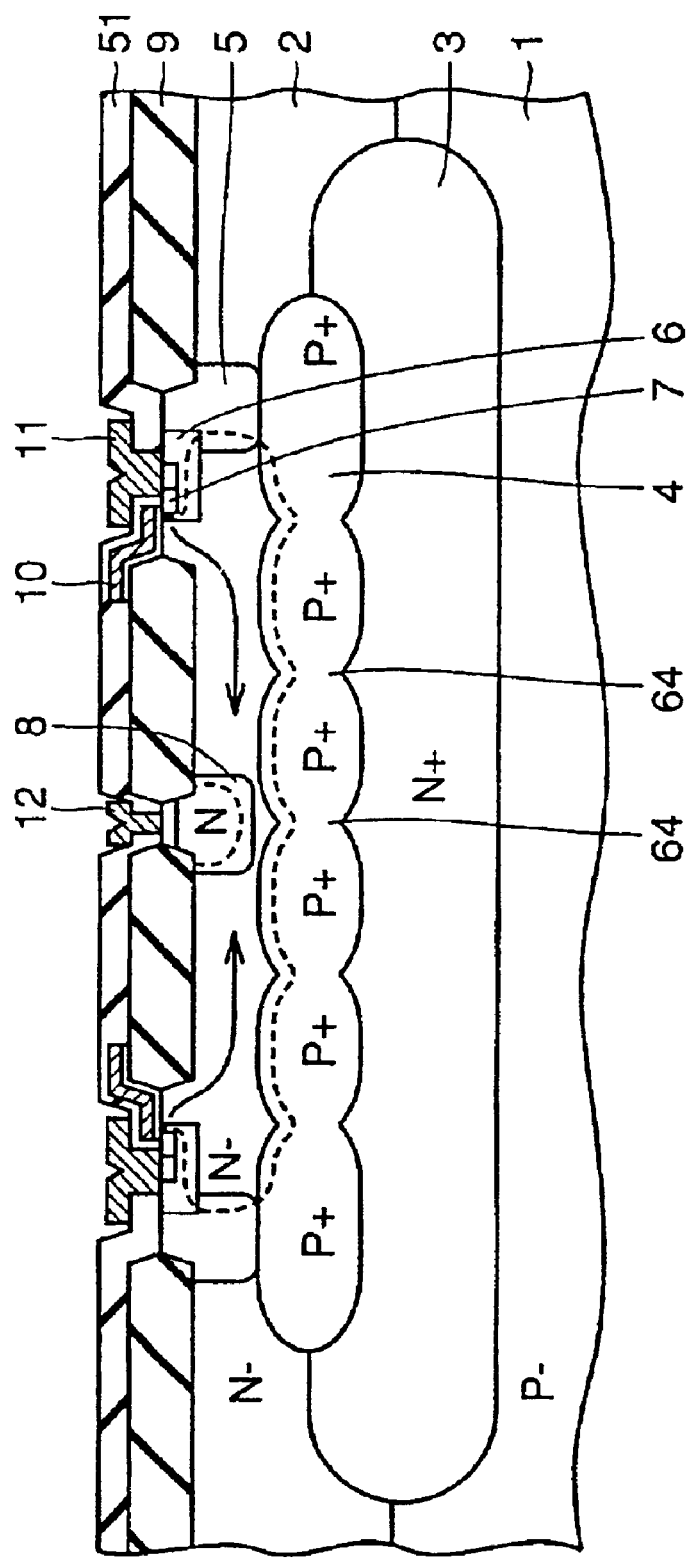
FIG. 16 is a cross section view showing the condition of the depletion layer in the OFF condition in the above embodiment.

In such cases, as shown in FIG. 16, many parts where the width of the depletion layer is expanded are formed in the OFF condition due to the fact that a plurality of narrowed parts are formed in the N+ buried diffusion region 3. As a result, the withstanding voltage in the part directly beneath the drain electrode 12 rises with respect to a semiconductor device which has a broader N diffusion region 8 so that the withstanding voltage of the entire semiconductor device can be increased.

Sixth Embodiment

Figure 17:
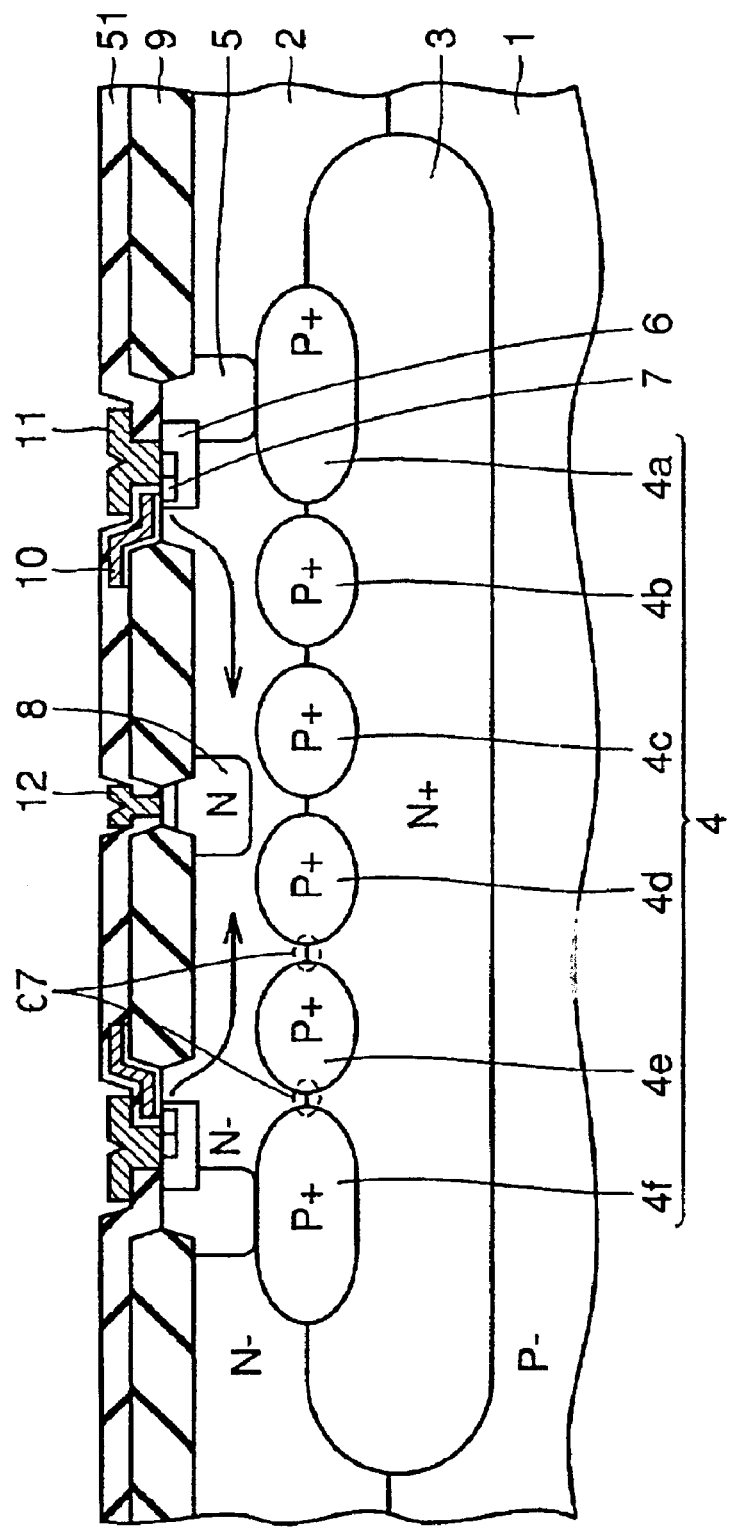
FIG. 17 is a cross section view of a semiconductor device according to a sixth embodiment of the present invention.

A semiconductor device including a DMOS transistor according to the sixth embodiment of the present invention is described. As shown in FIG. 17, in the present semiconductor device, a plurality of slits 67 are formed in the P+ buried diffusion regions 4a to 4f.

Here, the configuration not including the above is the same as in the semiconductor device as shown in FIG. 15, which is described in the fifth embodiment and, therefore, the same symbols are attached to the same components, of which the descriptions are omitted.

In this semiconductor device, the slits 67 are formed in the P+ buried diffusion region 4 in the same manner as in the case of the semiconductor device described in the second embodiment and, therefore, the effective thickness of the N− epitaxial layer can be made thicker in comparison with the semiconductor device described in the fifth embodiment. As a result, the withstanding voltage of a semiconductor device wherein a comparatively broad N+ buried diffusion region 3 is required can be further increased.

Figure 18:
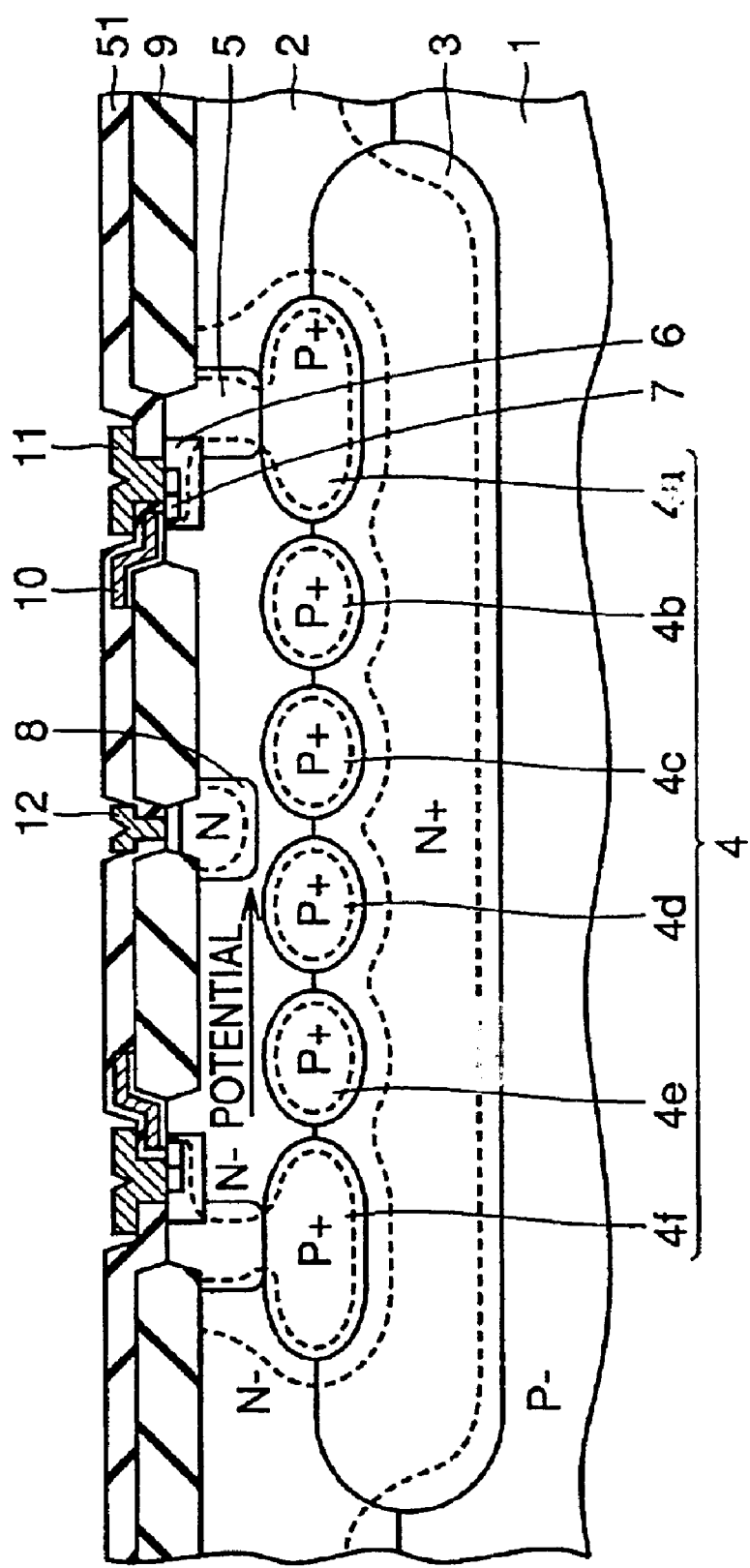
FIG. 18 is a cross section view showing the condition of the depletion layer in the OFF condition in the above embodiment.

In addition, in this semiconductor device, as shown in FIG. 18, each of the P+ buried diffusion regions 4b to 4e is surrounded by the N type semiconductor region around the periphery and, therefore, a depletion layer is formed so as to surround the periphery of the P+ buried diffusion region 4b at the point when the depletion layer extending from the side of the source (electrode 11) reaches, for example, the P+ buried diffusion region 4b. At the last stage when the depletion layer reaches the N diffusion region 8, all the P+ buried diffusion regions 4b to 4e are surrounded by the depletion layer.

In a region of the N− epitaxial layer 2 which is depleted, the potential rises toward the N diffusion region 8 as shown by an arrow. At this time, in the case that the P+ buried diffusion regions 4b to 4e are respectively in the condition of electrical floating, the potential of the P+ buried diffusion regions 4b to 4e increases along the direction toward the side of the N diffusion region 8 from the side of the P diffusion region 5 (each of the P+ buried diffusion regions 4a, 4f).

Thereby, the potential difference between the potential of, for example, the P+ buried diffusion regions 4c, 4d which are located in the vicinity directly beneath the N diffusion region 8 and the drain potential (potential of the N diffusion region 8) becomes smaller. As a result, the withstanding voltage of the semiconductor device can be increased by the amount by which the potential difference becomes smaller.

Seventh Embodiment

Figure 19:
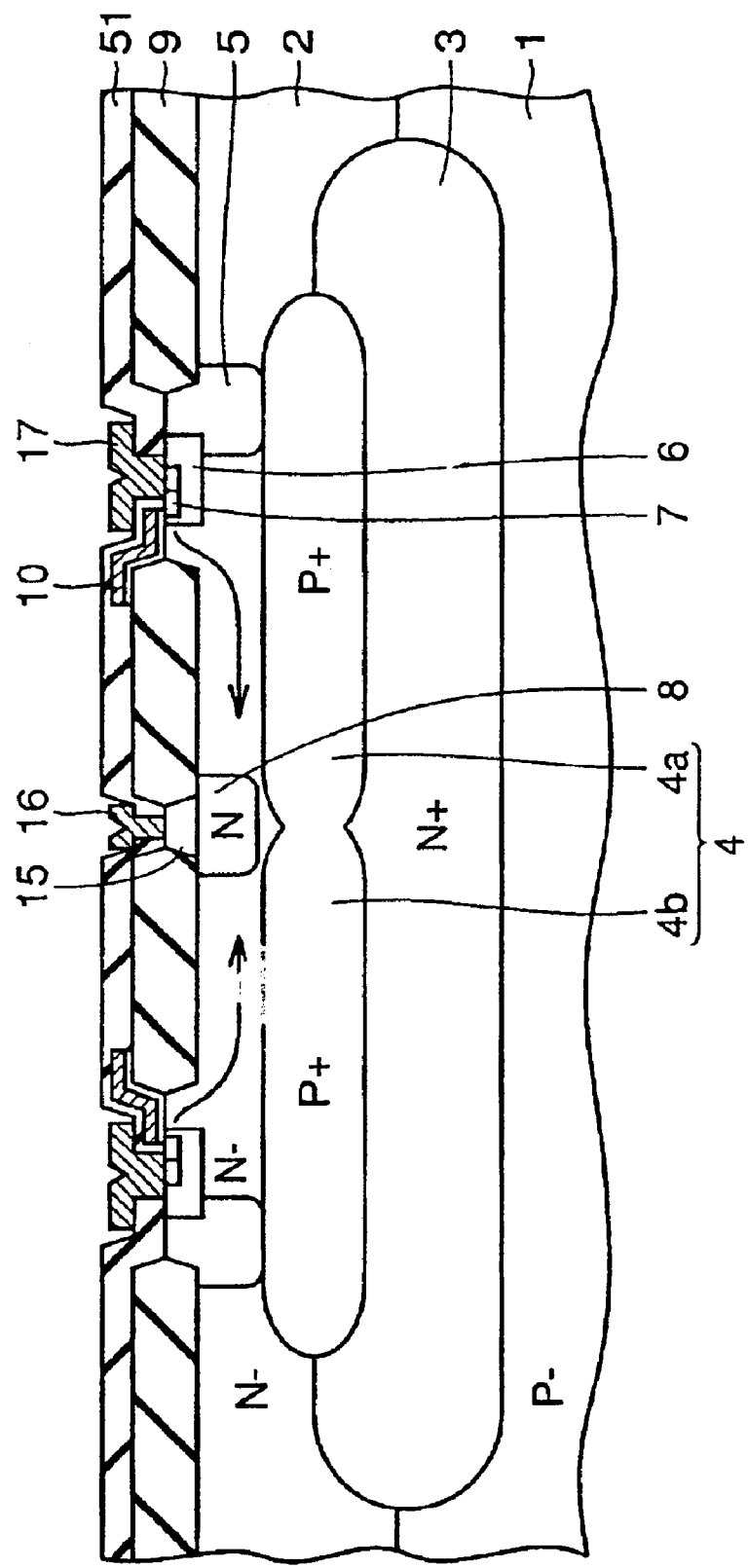
FIG. 19 is cross section view of a semiconductor device according to a seventh embodiment of the present invention.

A semiconductor device having an insulated gate bipolar transistor (hereinafter referred to as "IGBT") is described as a semiconductor device according to the seventh embodiment of the present invention. As shown in FIG. 19, an N diffusion region 7 is formed on the surface of an N− epitaxial layer 2. A P diffusion region 6 is formed so as to surround the N diffusion region 7 around the periphery.

In addition, a P+region 15 is formed on the surface of the N− epitaxial layer 2. An N diffusion region 8 is formed directly beneath the above P+ region 15. The P+ region 15 becomes a collector, the P diffusion region 6 becomes an emitter and the N− epitaxial layer 2 becomes the base. A collector electrode 16 is connected to the P+ region 15 while an emitter electrode 17 is connected to the P diffusion region 6.

In this transistor, a base current is supplied via the channel region formed in the P diffusion region 6 by applying a predetermined voltage to the gate electrode 10. Such a transistor is particularly referred to as IGBT. Here, the configuration not including the above is the same as in the semiconductor device as shown in FIG. 1, which is described in the first embodiment and, therefore, the same symbols are attached to the same components, of which the descriptions are omitted.

Figure 20:
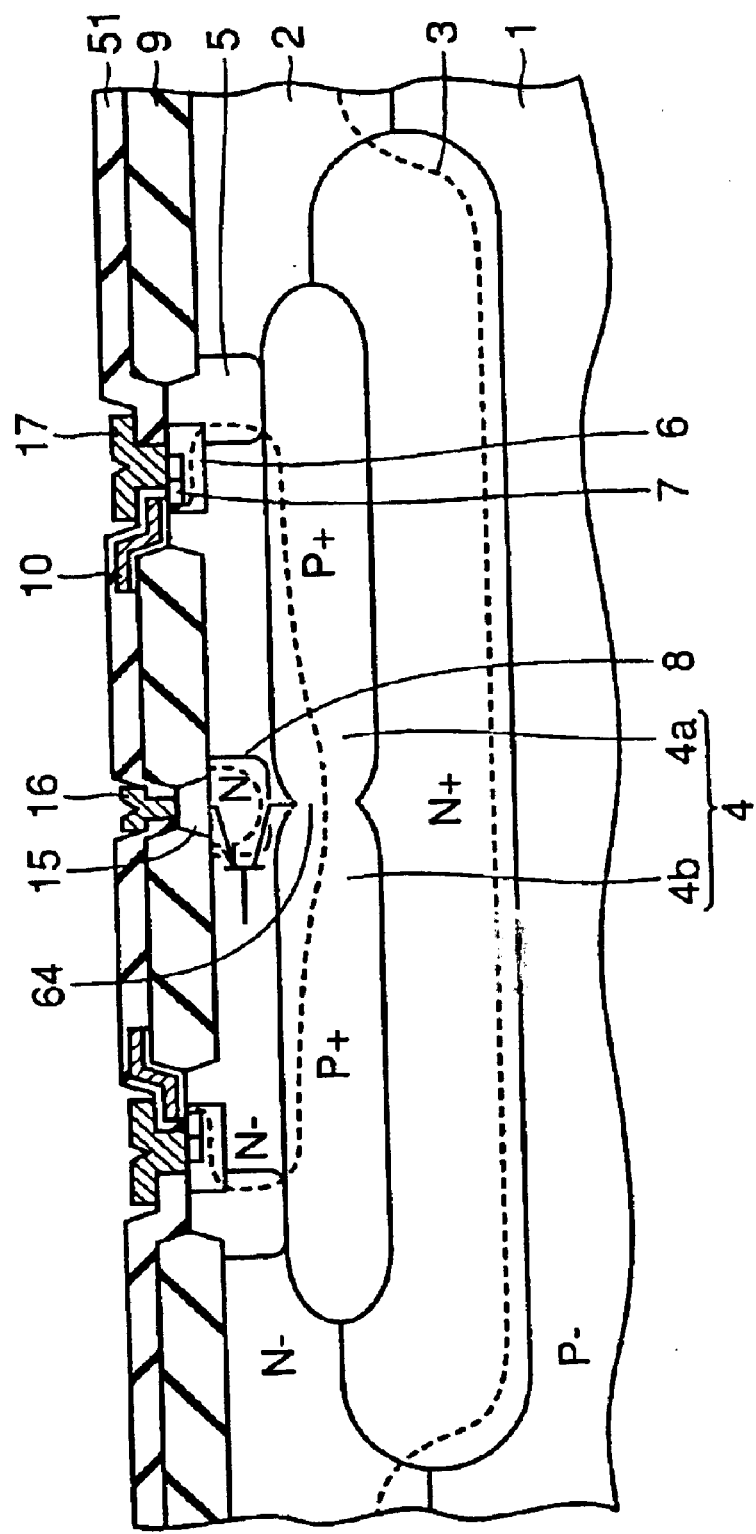
FIG. 20 is a cross section view showing the condition of the depletion layer in the OFF condition in the above embodiment.

In this semiconductor device, as shown in FIG. 20, the P+region 15, the N diffusion region 8, the N− epitaxial layer 2 and the P+ buried diffusion region 4 form a vertical type PNP transistor directly beneath the collector electrode 16. The withstanding voltage in the IGBT corresponds to the withstanding voltage (BVceo) between the collector and emitter when the base of this vertical type transistor is placed in the floating condition. Then, the base width in this transistor becomes the effective N− epitaxial layer 2.

In this IGBT, as shown in FIG. 20, a narrowed part 64 is formed in the part of the P+ buried diffusion region 4 located directly beneath the N diffusion region 8 and, therefore, as described in the first embodiment, the effective thickness of the N− epitaxial layer 2 increases in this part so that the width of the depletion layer in this part is broadened. Thereby, the withstanding voltage of the semiconductor device which has an IGBT increases in the OFF condition.

Eighth Embodiment

Figure 21:
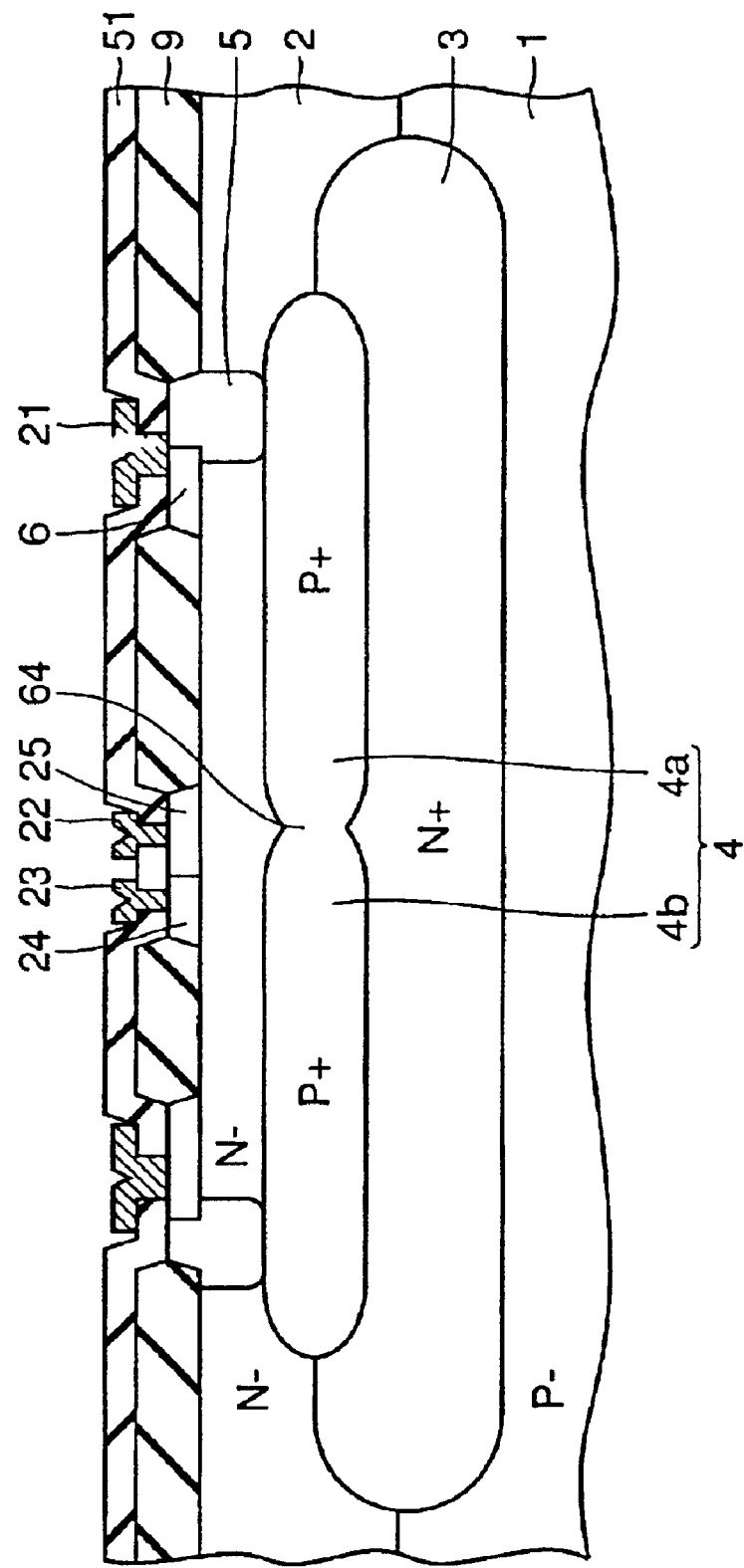
FIG. 21 is a cross section view of a semiconductor device according to an eighth embodiment of the present invention.

As a semiconductor device according to the eighth embodiment of the present invention, a semiconductor device which has a PNP transistor is described. As shown in FIG. 21, an N diffusion region 24 and a P diffusion region 25 are formed next to each other on the surface of the N− epitaxial layer 2. In addition, a P diffusion region 6 and a P diffusion region 5 are formed next to each other on the surface of the N− epitaxial layer 2 which is separated from the N diffusion region 24 and the P diffusion region 25 with a silicon oxide film 9 sandwiched in between.

A collector electrode 21 which is electrically connected to the P diffusion regions 5, 6 is formed. An emitter electrode 22 which is electrically connected to the P diffusion region 25 is formed. A base electrode 23 which is electrically connected to the P diffusion region 24 is formed. Here, the configuration not including the above is the same as in the semiconductor device as shown in FIG. 1, which is described in the first embodiment and, therefore, the same symbols are attached to the same components, of which the descriptions are omitted.

In this semiconductor device, a PNP transistor is formed with the P diffusion regions 5, 6 as well as the P+diffusion region 4 as a collector, with the P diffusion region 25 as an emitter and with the N− epitaxial layer 2 as a base.

The withstanding voltage in the semiconductor device corresponds to the withstanding voltage (BVceo) between the collector and the emitter when the base of this transistor is placed in the floating condition. This withstanding voltage tends to be lowered in accordance with the increase of the current amplification ratio hFE of the transistor and is in inverse proportion to the current amplification ratio hFE to the ⅓ to ¼ power.

Therefore, in the case that the withstanding voltage of the semiconductor device is desired to be increased, it is necessary to constrain the current amplification ratio hFE of the transistor to a certain degree. In particular, when the N− epitaxial layer 2 is used as a base, the value of the current amplification ratio hFE becomes, in many cases, several hundreds or more because the impurity concentration of the base is considerably low.

Figure 22:
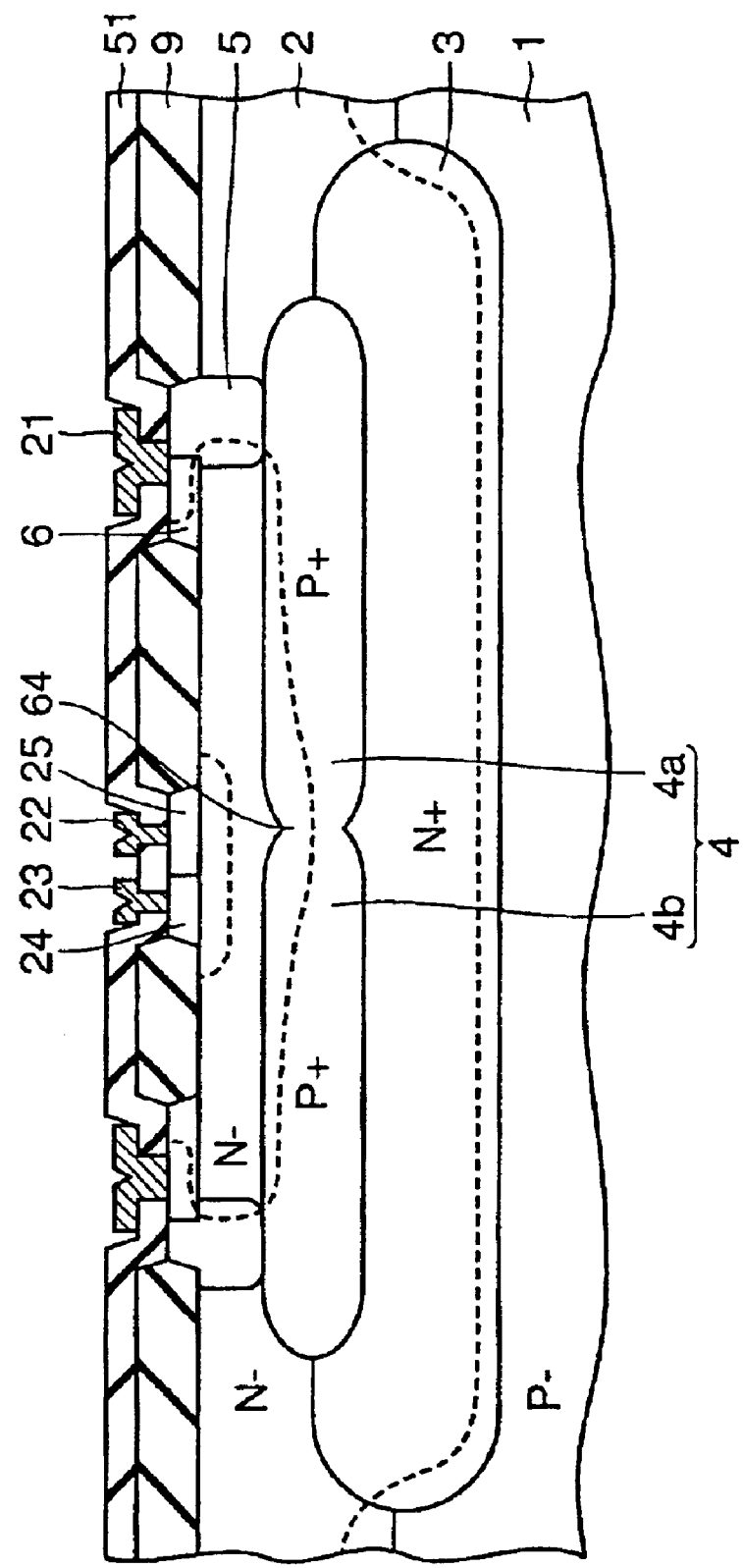
FIG. 22 is a cross section view showing the condition of the depletion layer in the OFF condition in the above embodiment.

In the present semiconductor device, as described in the first embodiment, a narrowed part 64 is formed in a part of the P+ buried diffusion region 4 and, thereby, the effective thickness of the N– epitaxial layer 2 which becomes a base increases so that, as shown in FIG. 22, the width of the depletion layer in this part is broadened. Thereby, the withstanding voltage of the semiconductor device which has a PNP transistor increases in the OFF condition.

Ninth Embodiment

Figure 23:
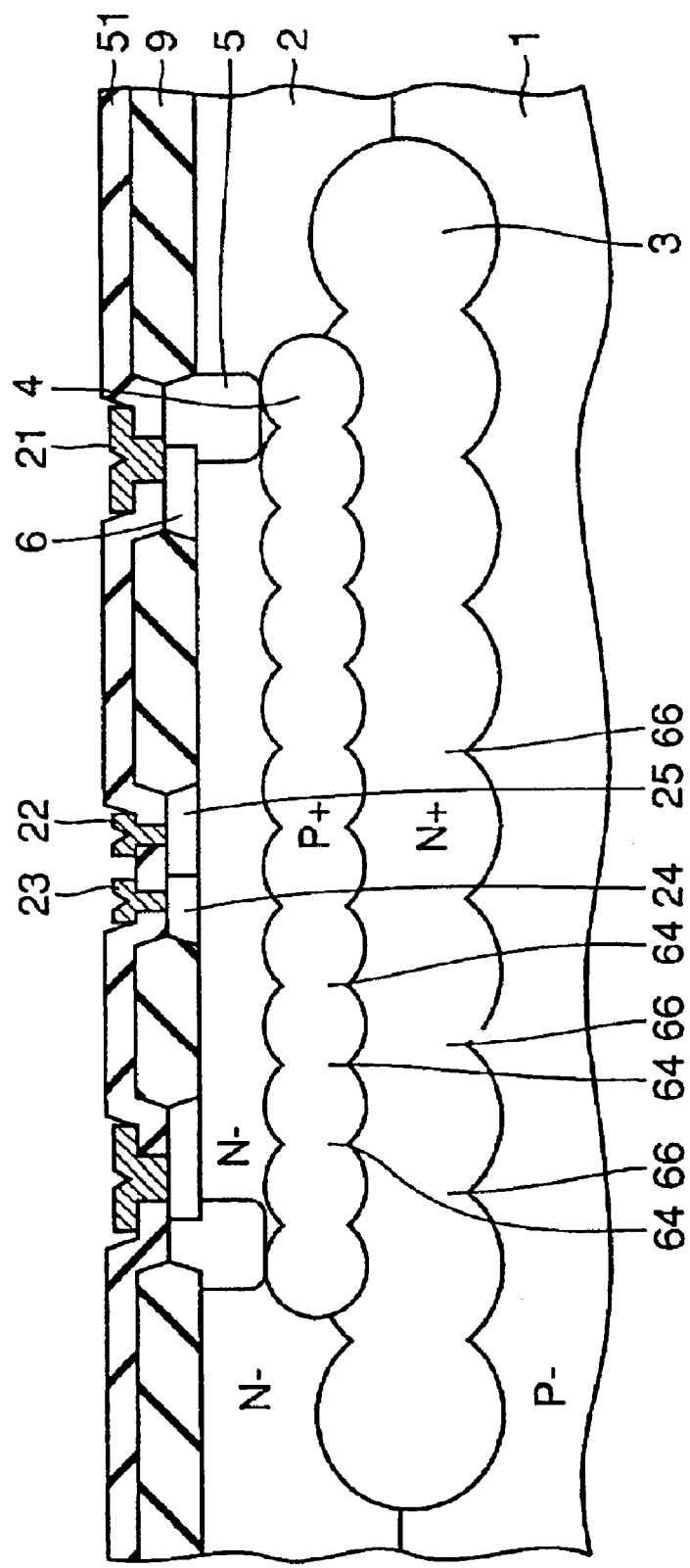
FIG. 23 is a cross section view of a semiconductor device according to a ninth embodiment of the present invention.

As a semiconductor device according to the ninth embodiment of the present invention, a semiconductor device which has a PNP transistor is described. As shown in FIG. 23, a plurality of narrowed parts 66 are formed in the N+ buried diffusion region 3. In addition, a plurality of narrowed parts 64 are also formed in the P+ buried diffusion region 4. Here, the configuration not including the above is the same as in the semiconductor device as shown in FIG. 21, which is described in the eighth embodiment and, therefore, the same symbols are attached to the same components, of which the descriptions are omitted.

As is already described, the N+ buried diffusion region 3, which has a plurality of narrowed parts 66, is formed by a plurality of impurity regions with intervals in between which are formed in advance and which diffuse through the subsequent heat processing so as to be connected to each other. The P+ buried diffusion region 4, which has a plurality of narrowed parts 64, is formed in the same manner.

Therefore, the N+ buried diffusion region 3 or the P+ buried diffusion region 4, which are integrated through the connections, are same as in the case where respective regions are formed integrally from the beginning and subsequent respective impurity concentrations are lowered. Thereby, the diffusion distance of the impurities which diffuse in the upward and downward directions from the N+ buried diffusion region 3, or from the P+ buried diffusion region 4, becomes shorter. That is to say, the diffusion in the upward and downward direction is constrained. In addition, the junction interface between the N+ buried diffusion region 3 and the P+ buried diffusion region 4 becomes uneven due to formation of a plurality of narrowed parts 64, 66, respectively, in the N+ buried diffusion region 3 and in the P+ buried diffusion region 4. As a result, the depletion layer which extends from the interface 68 between the N+ buried diffusion region 3 and the P+ buried diffusion region 4 is further expanded so that the withstanding voltage of the pn junction between the N+ buried diffusion region 3 and the P+ buried diffusion region 4 increases.

Figure 24:
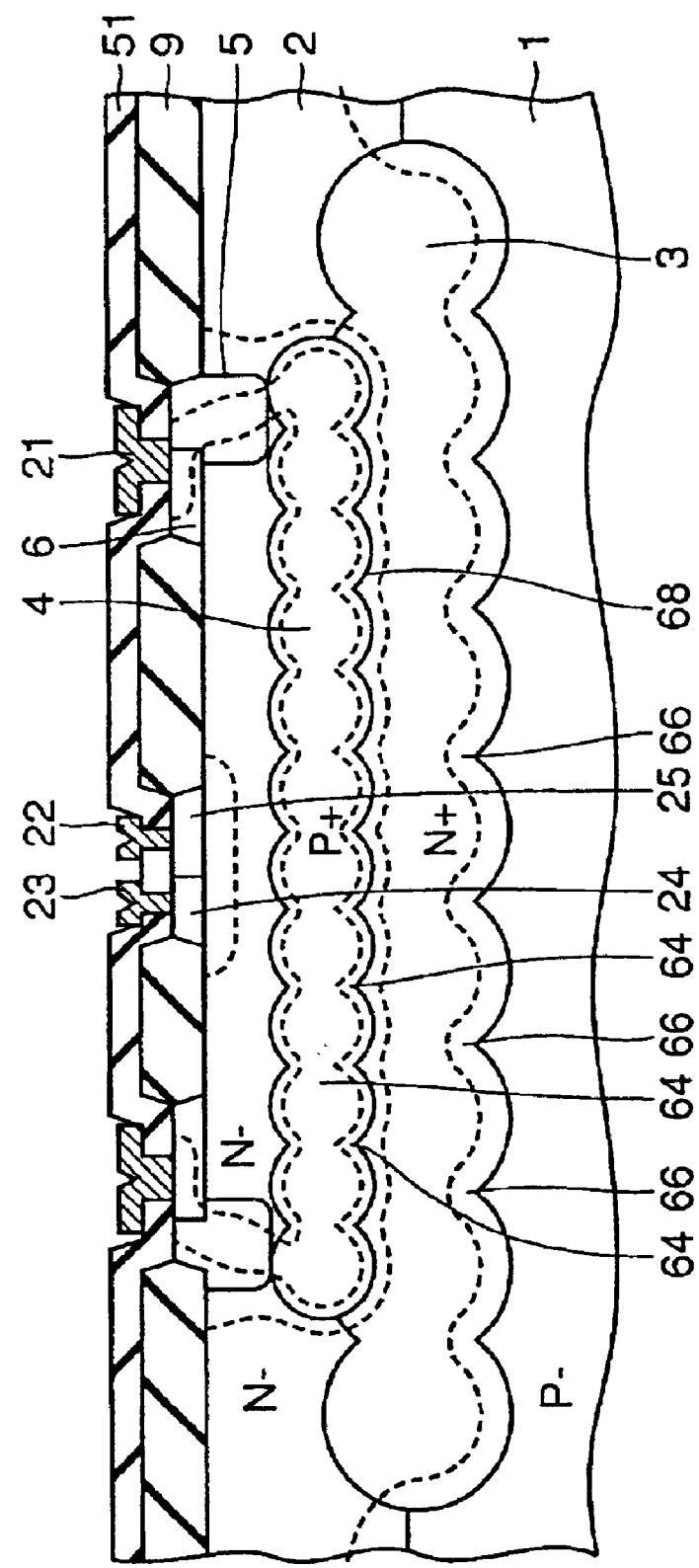
FIG. 24 is a cross section view showing the condition of the depletion layer in the OFF condition in the above embodiment.

In the semiconductor device which has this PNP transistor, the potential of the collector (N+ buried diffusion region 3) is in a negative bias condition depending on the application and there are cases where the withstanding voltage is required under that condition. In the case that a bias is applied between the N+ buried diffusion region 3 and the P+ buried diffusion region 4, as shown in FIG. 24, the depletion layer which extends from the interface between the P+ buried diffusion region 4 and the N– epitaxial layer 2 is added to the depletion layer which extends from the interface between the P+ buried diffusion region 4 and the N+ buried diffusion region 3.

As described above, this semiconductor device is equivalent to the conventional device wherein the impurity concentrations are lowered in the integrated N+ buried diffusion region 3 and P+ buried diffusion region 4. In addition, the interface 68 between the N+ buried diffusion region 3 and the P+ buried diffusion region 4 becomes uneven by forming the narrowed parts 64, 66.

Accordingly, the depletion layer which extends from the interface between the N+ buried diffusion region 3 and the P+ buried diffusion region 4 is further expanded. As a result, the withstanding voltage of the pn junction between the N+ buried diffusion region 3 and the P+ buried diffusion region 4 is increased so that the withstanding voltage of the semiconductor device can be increased in the condition where the potential of the collector is negatively biased.

Tenth Embodiment

Figure 25:
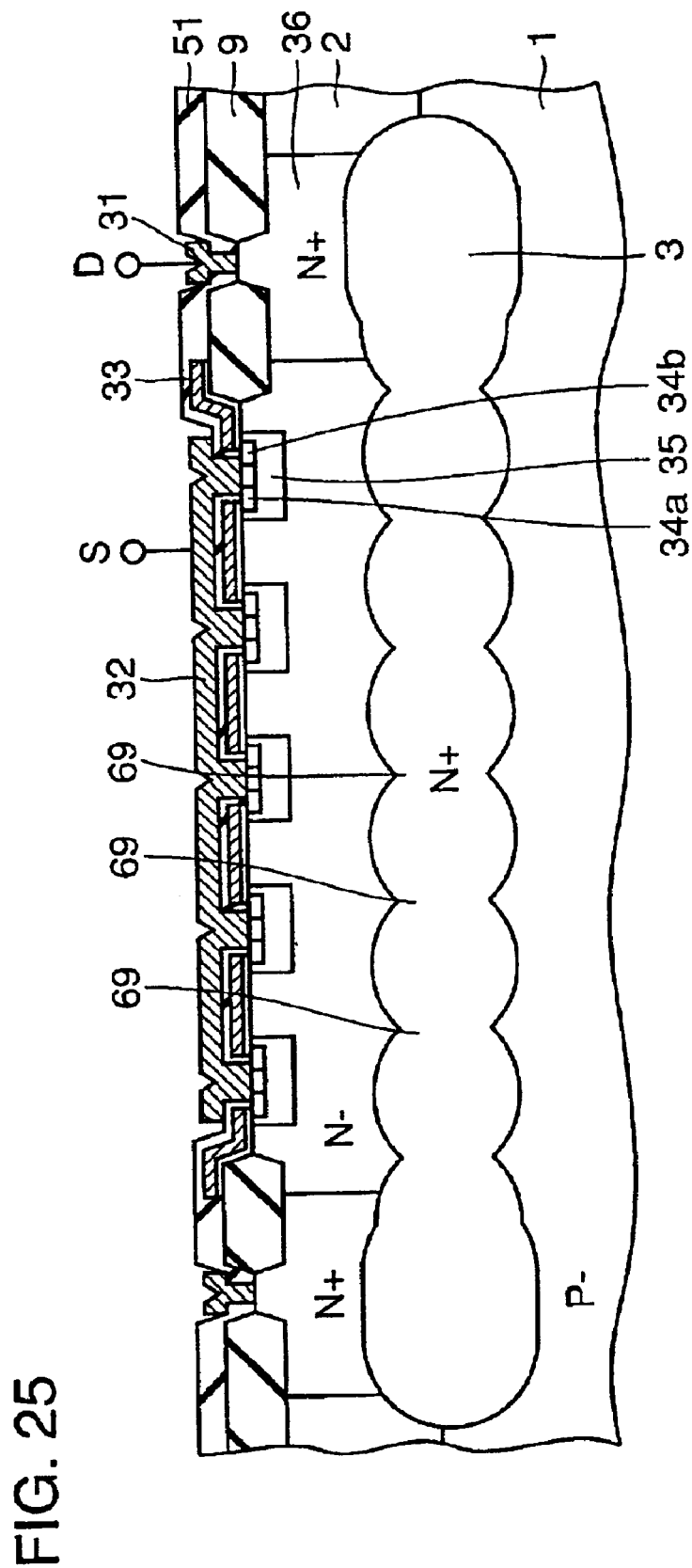
FIG. 25 is a cross section view of a semiconductor device according to a tenth embodiment of the present invention.

A semiconductor device including a vertical type DMOS transistor according to the tenth embodiment of the present invention is described. As shown in FIG. 25, an N– epitaxial layer 2 is formed on a P– silicon substrate 1. An N+ buried diffusion region 3, which has a plurality of narrowed parts 69, is formed between the P– silicon substrate 1 and the N– epitaxial layer 2.

N diffusion regions 34a, 34b or the like are formed on the surface of the N– epitaxial layer 2. P diffusion region 35 or the like are formed so as to surround the N diffusion regions 34a, 34b or the like around the periphery. In addition, an N+ diffusion region 36 which reaches to an N+ buried diffusion region 3 is formed id the surface of the N– epitaxal layer 2. A gate electrode 33 is formed above the surface of the P diffusion regions 35 or the like located between the N diffusion region 34a, 34b or the liked and the N+ epitaxial layer 2 with an insulating film interpolated in between.

A source electrode 32, which is electrically connected to the N diffusion regions 34a, 34b or the like, is formed. A drain electrode 31 is formed on the side opposite to the source electrode 32 with a silicon oxide film 9 sandwiched in between above the surface of the N– epitaxial layer 2. The drain electrode 31 is electrically connected to the N+diffusion region 36.

Figure 26:
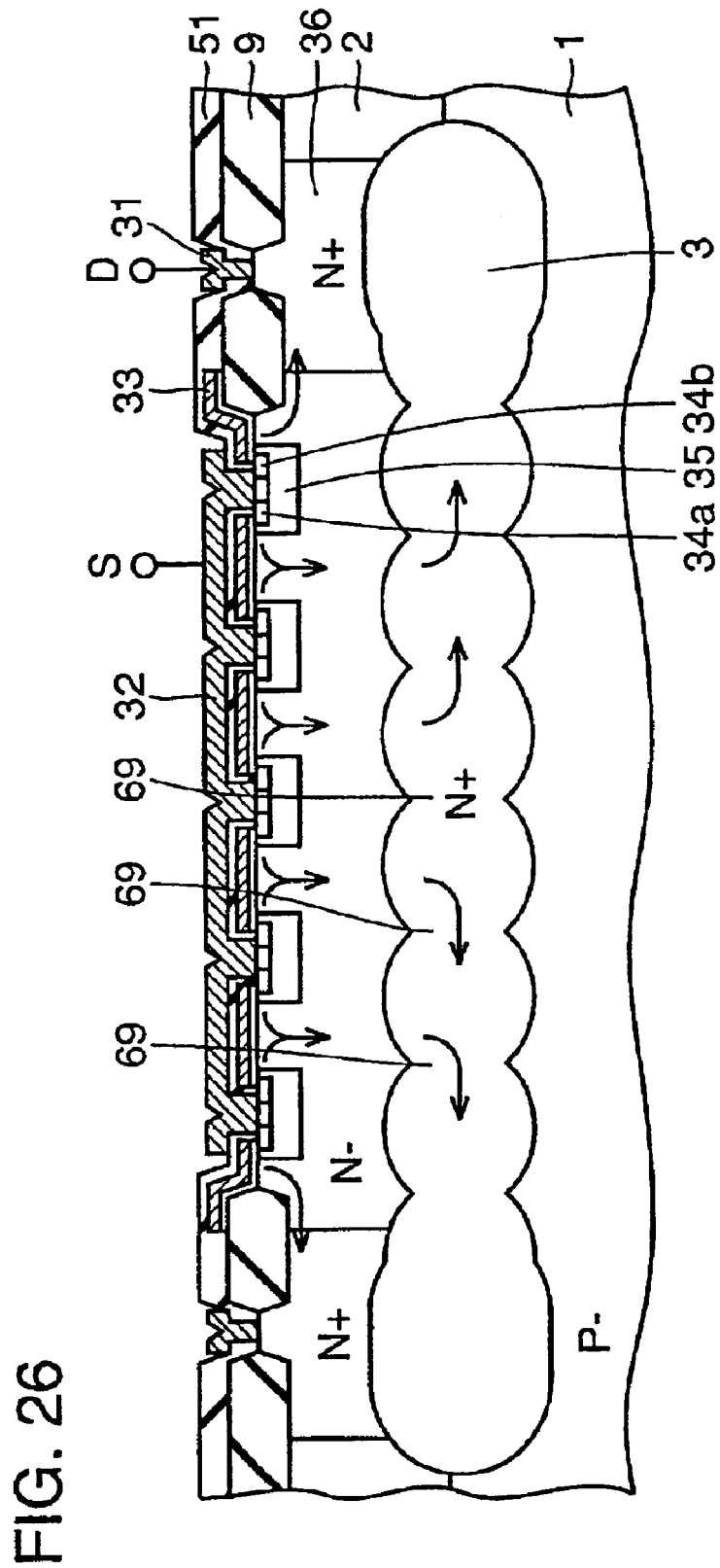
FIG. 26 is a cross section view showing the manner in which the current flows in the ON condition in the above embodiment.

In the present semiconductor device as shown in FIG. 26, by applying a voltage not less than a predetermined threshold voltage to the gate electrode 33, a current flows into the N– epitaxial layer 2 from the source electrode 32 through the N diffusion regions 34a, 34b or the like, reaches the N+ buried diffusion region 3 located below and flows into the drain electrode 31 from the N+ buried diffusion region 3 through the N+diffusion region 36. In this manner, a current flows in the vertical direction in the present semiconductor device.

A plurality of narrowed parts 69 are formed in the N+ buried diffusion region 3. Those narrowed parts 69 are formed by the same method as the method described in the first embodiment or the like.

Figure 27:
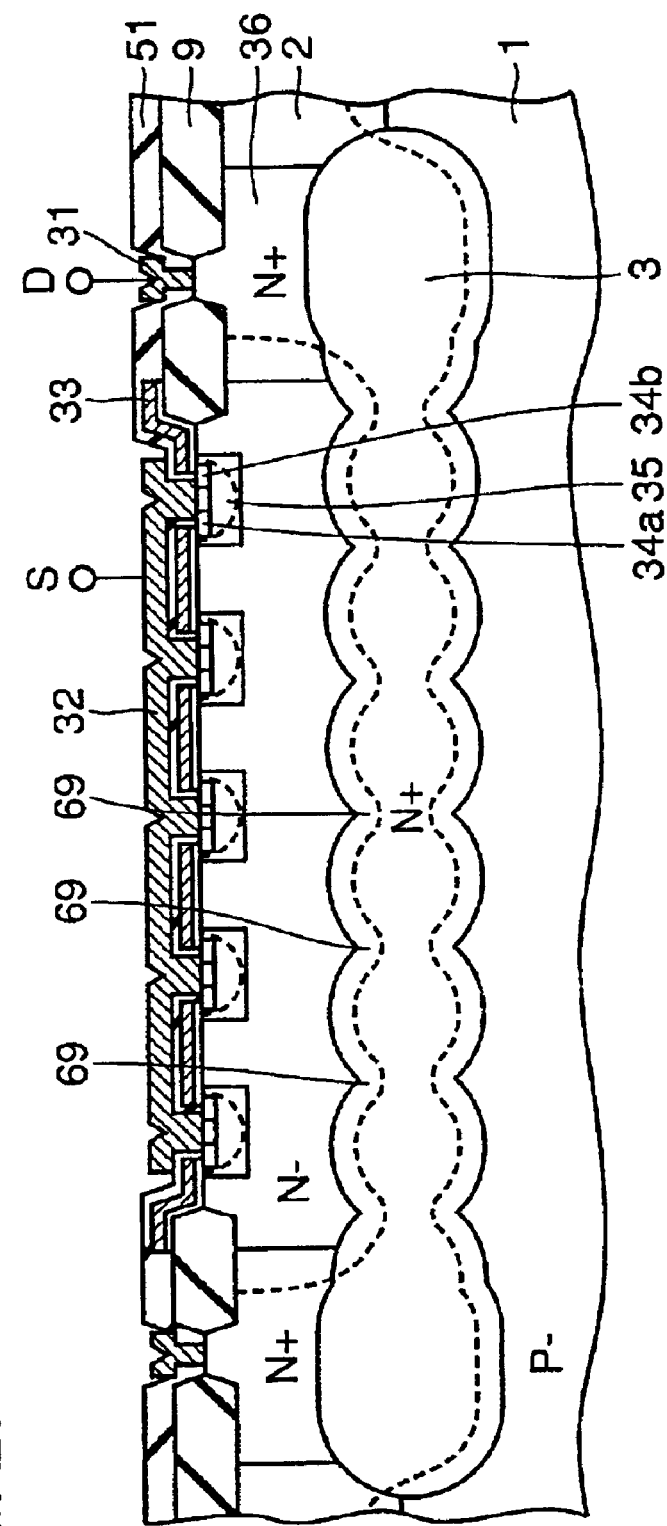
FIG. 27 is a cross section view showing the condition of the depletion layer in the OFF condition in the above embodiment.

In the OFF condition, as shown in FIG. 27, the depletion layer particularly extends from the interface between the P diffusion region 35 and the N– epitaxial layer 2. At this time, since a plurality of narrowed parts 69 are formed in the N+ buried diffusion region 3, the effective thickness of the N– epitaxial layer 2 increases in these parts so that the edge of the depletion layer which extends to the side of the N+ buried diffusion region 3 can reach a deeper position. Thereby, the width of the depletion layer in these parts is broadened so that the withstanding voltage of the semiconductor device, which has a vertical type DMOS transistor, can be increased.

Eleventh Embodiment

Figure 28:
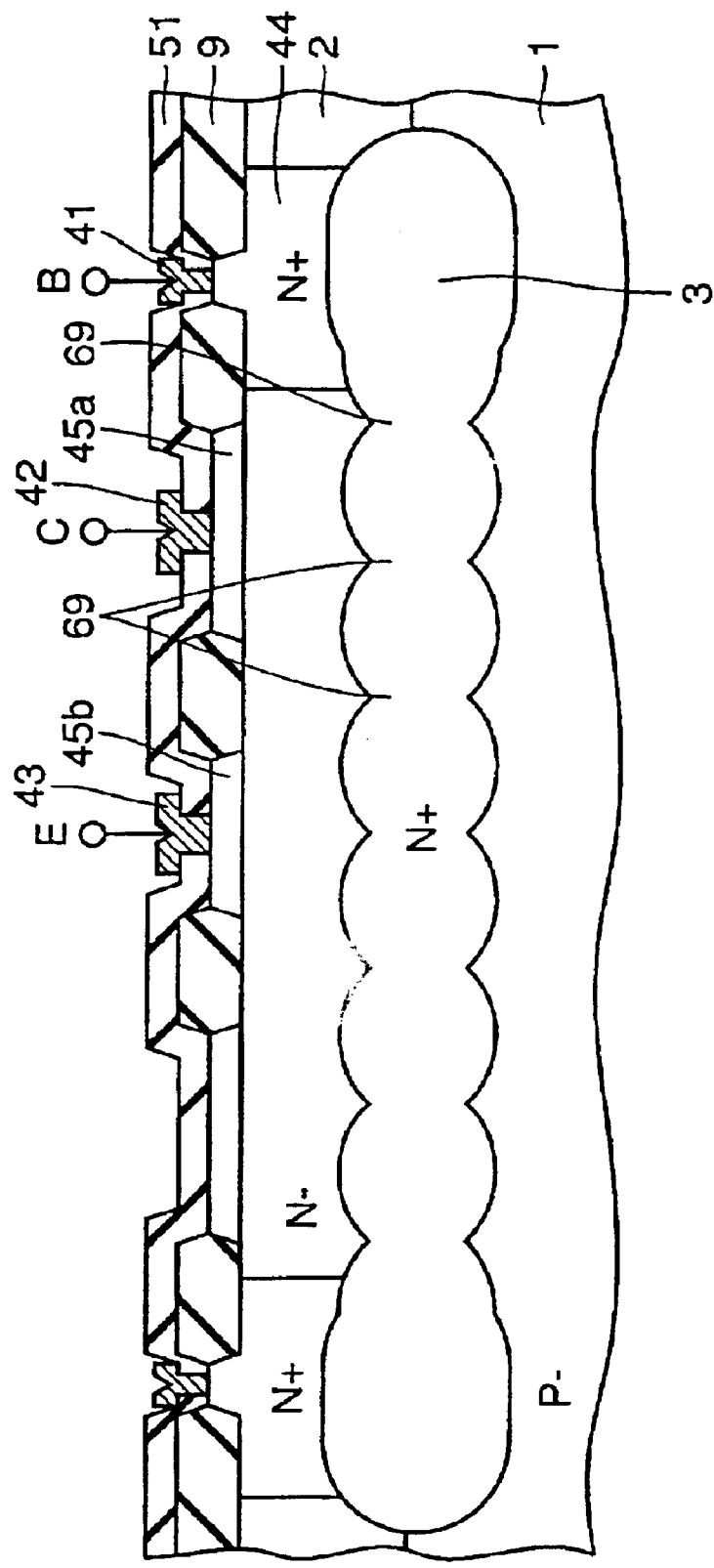
FIG. 28 is cross section view of a semiconductor device according an eleventh embodiment of the present invention.

A semiconductor device according to the eleventh embodiment of the present invention is described. As shown in FIG. 28, P diffusion regions 45a, 45b are formed with an interval in between on the surface of an N– epitaxial layer 2. In addition, an N+diffusion region 44 which contacts with the N+ buried diffusion region 3 is formed in the surface of the N– epitaxial layer 2.

A collector electrode 42 which is electrically connected to the P diffusion region 45a is formed. An emitter electrode 43 which is electrically connected to the P diffusion region 45b is formed. A base electrode 41 which is electrically connected to the N+ diffusion region 44 is formed. Here, the configuration, with the exception of the above, is the same as of the semiconductor device as shown in FIG. 25 which is described in the tenth embodiment and, therefore, the same signs are attached to the same components, of which the descriptions are omitted.

In this semiconductor device, a lateral type PNP transistor is formed with the P diffusion region 45a as a collector, with the P diffusion region 45b as an emitter and the N– epitaxial layer 2 as a base.

In the lateral type PNP transistor, in the case that the effective thickness of the part of the N– epitaxial layer 2 which is located in the region directly beneath the P diffusion region 45b which is an the emitter is comparatively thin, the injection efficiency of the holes which are injected into the N– epitaxial layer 2 from the P diffusion region 45b deteriorates. Therefore, a problem arises that the current amplification ratio hFE is lowered in the transistor.

In addition, in the case that the effective thickness of the part of N– epitaxial layer 2 that is located in a region directly beneath the P diffusion region 45a, which is a collector, is comparatively thin, the expansion of the depletion layer directly beneath the collector is constrained. Therefore, a problem arises that the withstanding voltage (BVceo) between the collector and the emitter is lowered.

Figure 29:
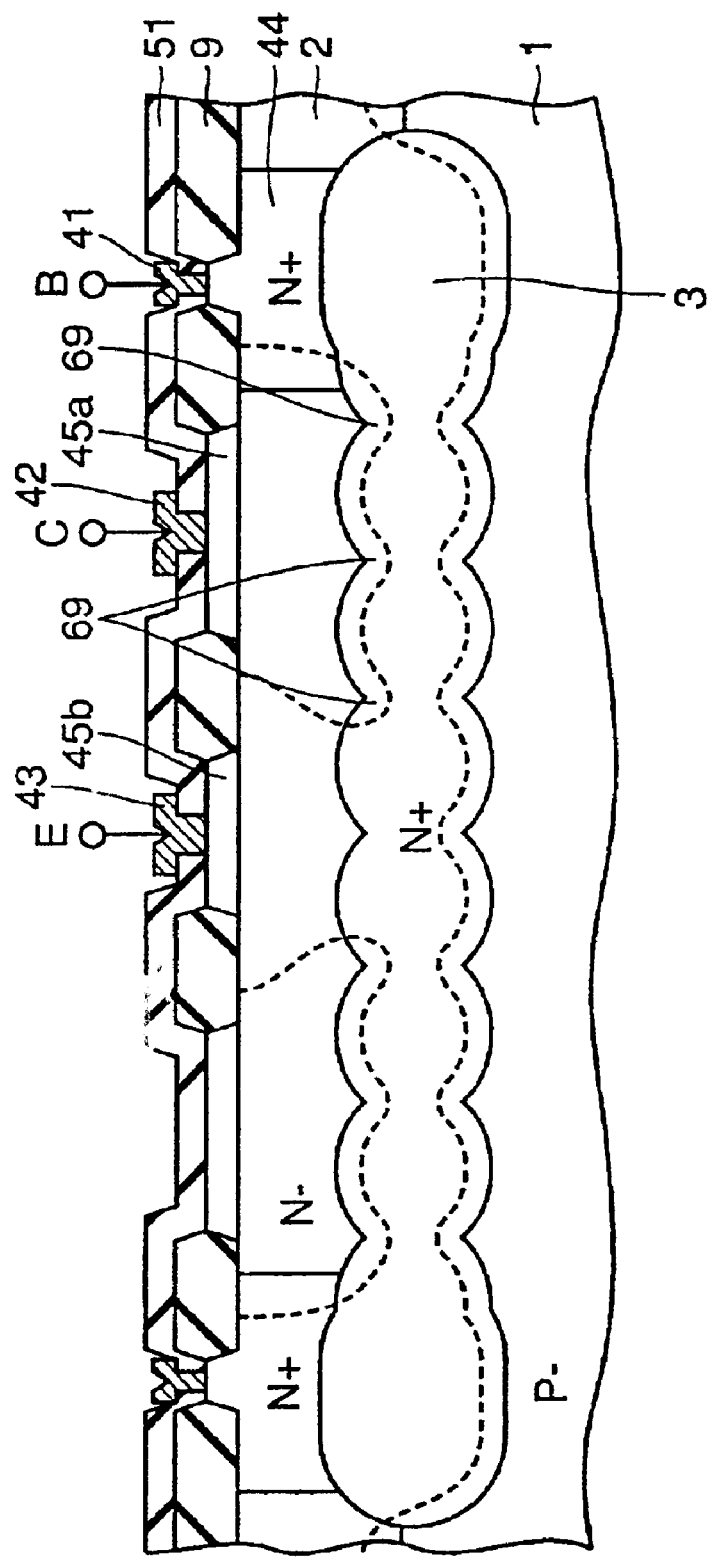
FIG. 29 is a cross section view showing the condition of the depletion layer in the OFF condition in the above embodiment.
Figure 30:
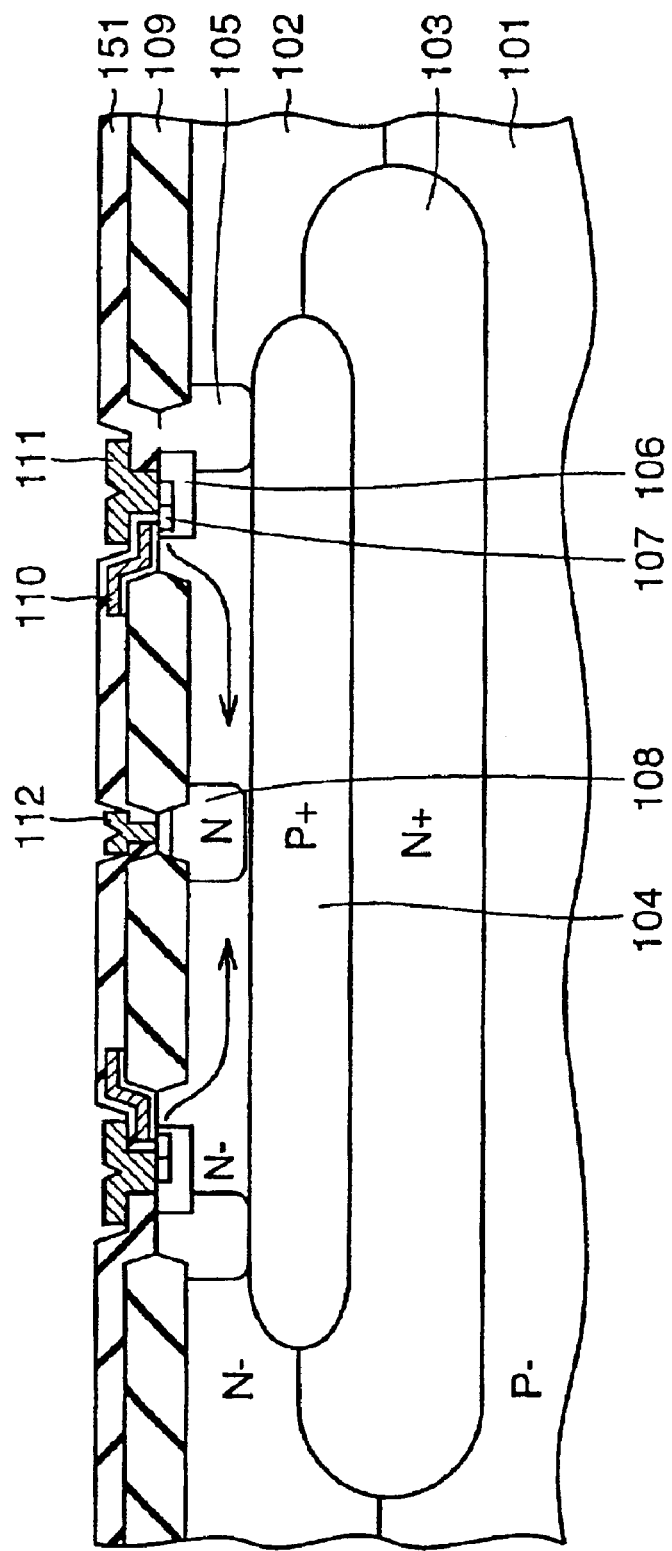
FIG. 30 is a cross section view of a semiconductor device according to a prior art.
Figure 31:
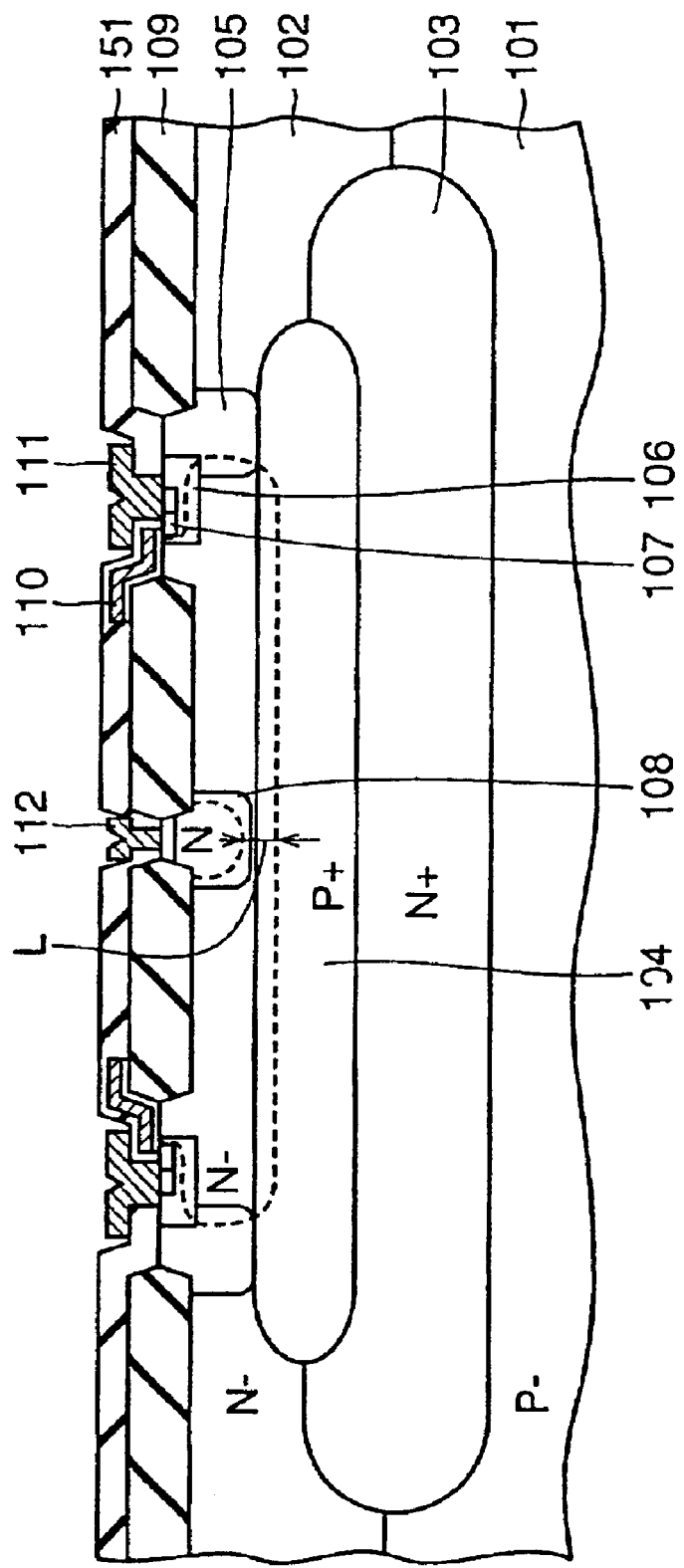
FIG. 31 is a cross section view showing the condition of the depletion layer in the OFF condition of a semiconductor device according to a prior art.

In the OFF condition in the present semiconductor device, as shown in FIG. 29, the depletion layer extends, in particular, from the interface between the P diffusion region 45a and the N– epitaxial layer 2. At this time, a plurality of narrowed parts 69 are formed in the N+ buried diffusion region 3 which is located in the direction in which the depletion layer extends and, therefore, the substantial thickness of the N– epitaxial layer 2 is increased in the above parts so that the edge of the depletion layer which extends to the side of the N+ buried diffusion region 3 can reach to a deeper position. Thereby, the depletion layer is broadened so that the withstanding voltage of the semiconductor device can be increased.

In addition, since the effective thickness of the N– epitaxial layer 2 is increased, it becomes possible to prevent the current amplification ratio hFE from becoming lower by preventing the injection efficiency of the holes, which are injected from the P diffusion region 45b to the N– epitaxial layer 2, from deteriorating. In this manner according to the present semiconductor device the above described problem with the transistor can be solved.

Figure 32:
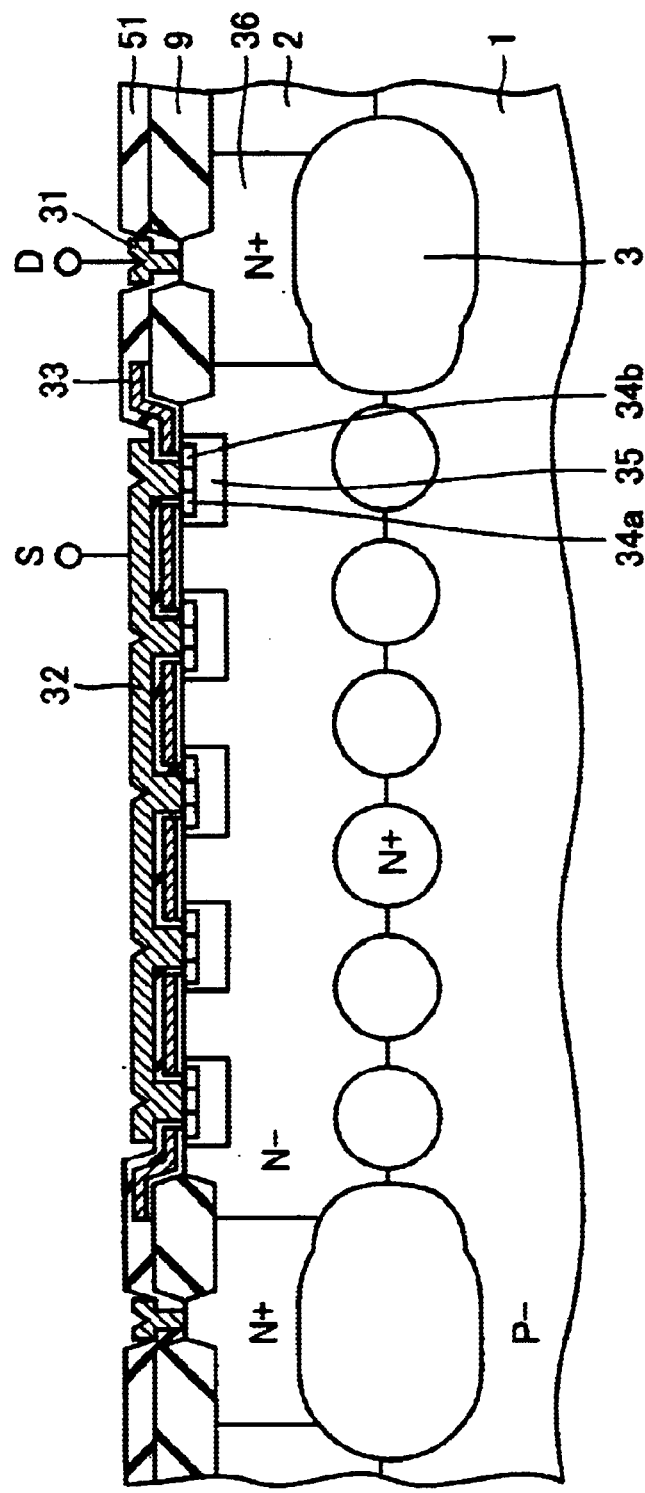
FIG. 32 is a cross section view of semiconductor device according to the tenth embodiment of the present invention in which the buried impurity region includes slits.
Figure 33:
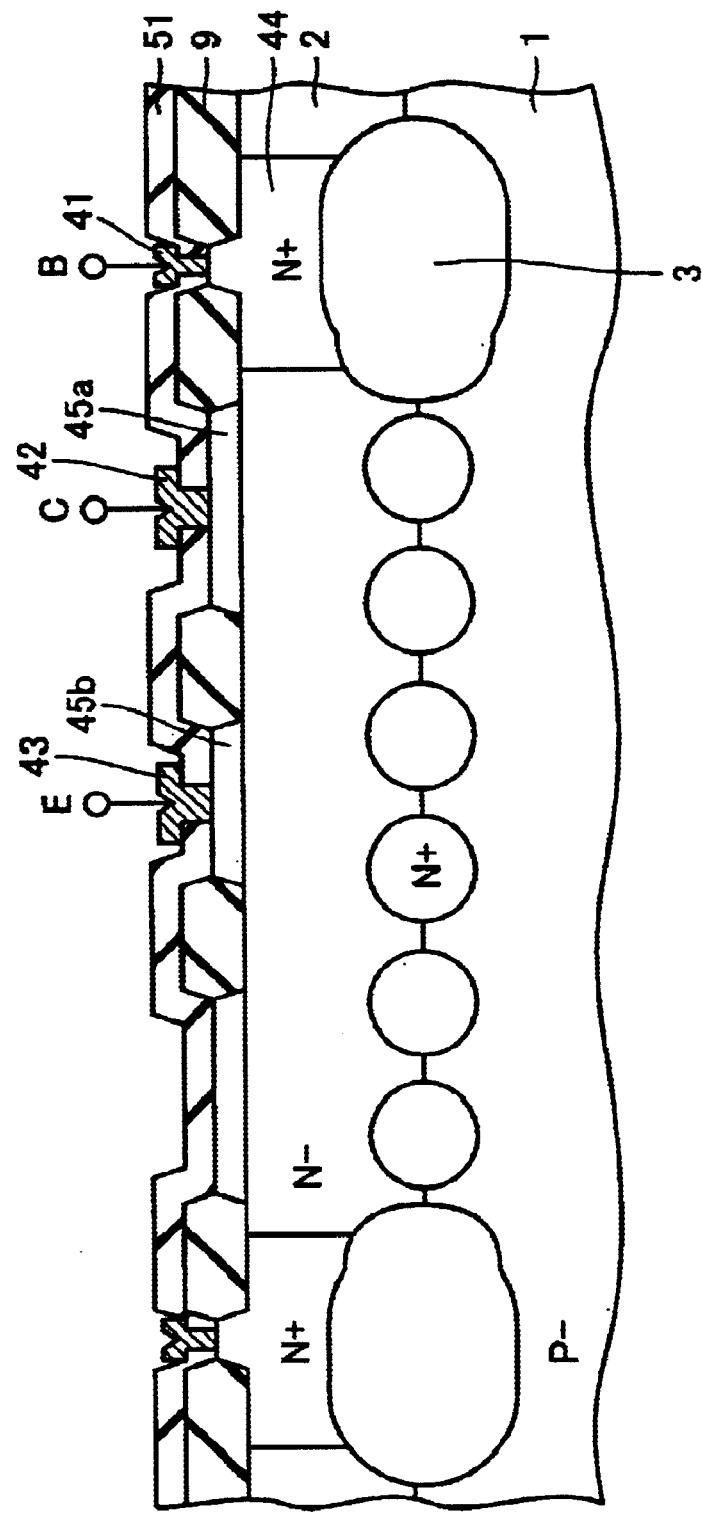
FIG. 33 is a cross section view of a semiconductor device according to the eleventh embodiment of the present invention in which the buried impurity region includes slits.

Here, though the case wherein narrowed parts are formed in the N+ buried diffusion region is described in the tenth and eleventh embodiments, the structure where slits with proper intervals are provided can improve the withstanding voltage in the same manner. These structures of the tenth and eleventh embodiments, in which the N+ buried diffusion region includes slits, are respectively shown in FIGS. 32 and 33.

It should be taken into account that embodiments disclosed in this case are illustrative in all respects and are not limitative. The scope of the invention is shown not by the above description but, rather, by the scope of the claims and is intended to include meanings which are equivalent to the scope of the claims and all of the modifications within the scope.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including:
   a semiconductor substrate having a main surface;
   a semiconductor layer of a first conductive type which is formed on the main surface of said semiconductor substrate;
   a first buried impurity region of the first conductive type formed between said semiconductor layer and said semiconductor substrate;
   a second buried impurity region of a second conductive type positioned between said first buried impurity region and said semiconductor layer alone a line normal to said main surface;
   a first impurity region of the second conductive type which is formed in the surface of said semiconductor layer and which is electrically connected to said second buried impurity region;
   a second impurity region of the first conductive type which is formed in the surface or inside of said semiconductor layer located in a region above said second buried impurity region; and
   a semiconductor element which includes said first impurity region and said second impurity region and which has a switching function formed on the surface of said semiconductor layer,
   wherein the withstanding voltage is secured by a depletion layer extending from an interface between said second buried impurity region and said semiconductor layer under the condition where said semiconductor element is turned OFF; and
   said second buried impurity region includes a first gap part wherein said second buried impurity region is disconnected, said gap part of the second buried impurity region positioned directly beneath said second impurity region.

2. The semiconductor device according to claim 1, wherein said semiconductor element includes:
   a third impurity region of the first conductive type formed on the surface of said first impurity region so as to be surrounded by said first impurity region; and
   an electrode part formed over said first impurity region, said first impurity region sandwiched between said third impurity region and said semiconductor layer with an insulating film in between the electrode part and the first impurity region.

3. The semiconductor device according to claim 2, wherein said semiconductor element further includes a fourth impurity region of the second conductive type which is formed so as to contact with said second impurity region.

4. The semiconductor device according to claim 1, wherein said semiconductor element includes a fifth impurity region of the second conductive type which is formed on a surface of said semiconductor layer.

5. The semiconductor device according to claim 1, wherein said second buried impurity region includes a plurality of said first gap parts.

6. The semiconductor device according to claim 6, wherein said second buried impurity region includes a plurality of regions which are, respectively, made to be in an electrically floating condition by a plurality of said first gap parts.

7. The semiconductor device according to claim 1, wherein said first buried impurity region includes a recessed part wherein a surface of said first buried impurity region is recessed in the direction away from said second impurity region in a part located, approximately, directly beneath said first gap part or a second gap part wherein said first buried region is disconnected.

8. The semiconductor device according to claim 4, wherein a junction interface between said first buried impurity region and said second buried impurity region is uneven.

9. A semiconductor device including:

a semiconductor substrate having a main surface;

a semiconductor layer of a first conductive type formed on the main surface of said semiconductor substrate;

a buried impurity region of the first conductive type formed between said semiconductor substrate and said semiconductor layer;

a first impurity region of the first conductive type which is formed on the surface of said semiconductor layer and which is electrically connected to said buried impurity region;

a second impurity region of a second conductive type formed on a surface of said semiconductor layer located in a region above said buried impurity region; and a semiconductor element which includes said first impurity region and said second impurity region and which has a switching function formed on the surface of said semiconductor layer, wherein a withstanding voltage is secured by a depletion layer extending from an interface between said second impurity region and said semiconductor layer under the condition where said semiconductor element is turned off; and said buried impurity region includes a gap part wherein said buried region is disconnected, said gap part of the buried impurity region positioned directly beneath said second impurity region.

10. The semiconductor device according to claim 9, wherein said semiconductor element includes:

a third impurity region of the first conductive type formed on a surface of said second impurity region so as to be surrounded by said second impurity region; and an electrode part formed over said second impurity region, said second impurity region sandwiched by said third impurity region and said semiconductor layer with an insulating film in between the electrode part and the first impurity region.

11. The semiconductor device according to claim 9, wherein said semiconductor element includes a fourth impurity region of the second conductive type formed on a surface of said semiconductor layer.

12. The semiconductor device according to claim 9, wherein said gap part is formed in a part that is in the direction to which said depletion layer extends.

* * * * *